(12) United States Patent
Graham-Lengrand

(10) Patent No.: US 12,683,629 B2
(45) Date of Patent: Jul. 14, 2026

(54) STORAGE AND COMMUNICATING BITS OF INFORMATION IN COMPOSITE CLASSES OF VALID DATA

(71) Applicant: SRI International, Menlo Park, CA (US)

(72) Inventor: Stephane Graham-Lengrand, Mountain View, CA (US)

(73) Assignee: SRI International, Menlo Park, CA (US)

( * ) Notice: Subject to any disclaimer, the term of this patent is extended or adjusted under 35 U.S.C. 154(b) by 155 days.

(21) Appl. No.: 18/661,280

(22) Filed: May 10, 2024

(65) Prior Publication Data

US 2025/0047301 A1      Feb. 6, 2025

Related U.S. Application Data

(60) Provisional application No. 63/465,757, filed on May 11, 2023.

(51) Int. Cl.
H03M 7/00 (2006.01)
H03M 7/30 (2006.01)

(52) U.S. Cl.
CPC ....... H03M 7/6011 (2013.01); H03M 7/6005 (2013.01); H03M 7/6076 (2013.01); H03M 7/6082 (2013.01)

(58) Field of Classification Search
CPC ............. H03M 7/6011; H03M 7/6005; H03M 7/6076; H03M 7/6082; H03M 7/00
USPC ...................................................... 341/50, 51
See application file for complete search history.

(56) References Cited

U.S. PATENT DOCUMENTS

| | | | |
|---|---|---|---|
| 7,161,507 B2 | 1/2007 | Tomic | |
| 7,653,520 B2 | 1/2010 | De Moura et al. | |
| 9,128,697 B1 | 9/2015 | Potter et al. | |
| 9,740,655 B2 | 8/2017 | Hartwich | |
| 9,772,849 B2 | 9/2017 | Evans et al. | |
| 10,886,942 B2 | 1/2021 | Rovers | |
| 11,423,247 B2 | 8/2022 | Tiwari et al. | |
| 2006/0055569 A1 | 3/2006 | Tomic | |
| 2007/0040710 A1 | 2/2007 | Tomic | |
| 2014/0328357 A1 | 11/2014 | Fredriksson et al. | |
| 2015/0339254 A1 | 11/2015 | Hartwich | |
| 2016/0359576 A1 | 12/2016 | Fredriksson et al. | |
| 2018/0175958 A1 | 6/2018 | Fredriksson et al. | |
| 2019/0363814 A1 | 11/2019 | Fredriksson et al. | |
| 2020/0394446 A1* | 12/2020 | Tiwari .................... G06F 18/22 | |
| 2024/0155146 A1* | 5/2024 | Lundberg ............. H04N 19/184 | |

OTHER PUBLICATIONS

"DARPA, Lockheed Martin Demonstrate Technologies to Enable a Connected Warfighter Network," Lockheed Martin Aeronautics Company, Jul. 13, 2018. 3 pp.

* cited by examiner

*Primary Examiner* — Jean B Jeanglaude
(74) *Attorney, Agent, or Firm* — Shumaker & Sieffert, P.A.

(57) ABSTRACT

An example method includes determining, by processing circuitry and based on a bitstring format, a first set of bitstrings for a first transcoder, determining, by the processing circuitry and based on the bitstring format, a second set of bitstrings for a second transcoder, wherein no bitstring of the first set of bitstrings matches a bitstring of the second set of bitstrings, and outputting, by the processing circuitry, an indication of a first bit value assigned to the first transcoder and a second bit value assigned to the second transcoder.

20 Claims, 10 Drawing Sheets

100

100

122

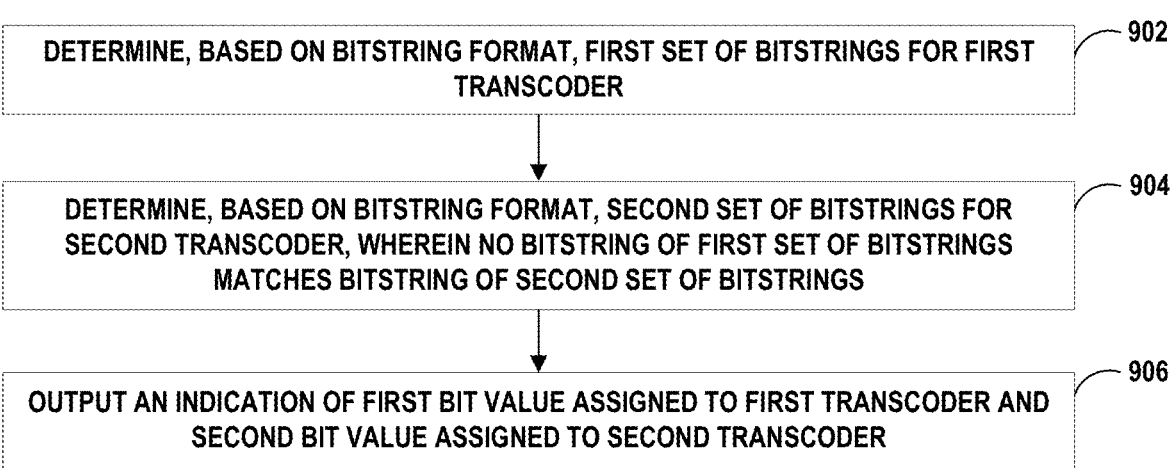

DETERMINE, BASED ON BITSTRING FORMAT, FIRST SET OF BITSTRINGS FOR FIRST TRANSCODER    902

DETERMINE, BASED ON BITSTRING FORMAT, SECOND SET OF BITSTRINGS FOR SECOND TRANSCODER, WHEREIN NO BITSTRING OF FIRST SET OF BITSTRINGS MATCHES BITSTRING OF SECOND SET OF BITSTRINGS    904

OUTPUT AN INDICATION OF FIRST BIT VALUE ASSIGNED TO FIRST TRANSCODER AND SECOND BIT VALUE ASSIGNED TO SECOND TRANSCODER    906

FIG. 9A

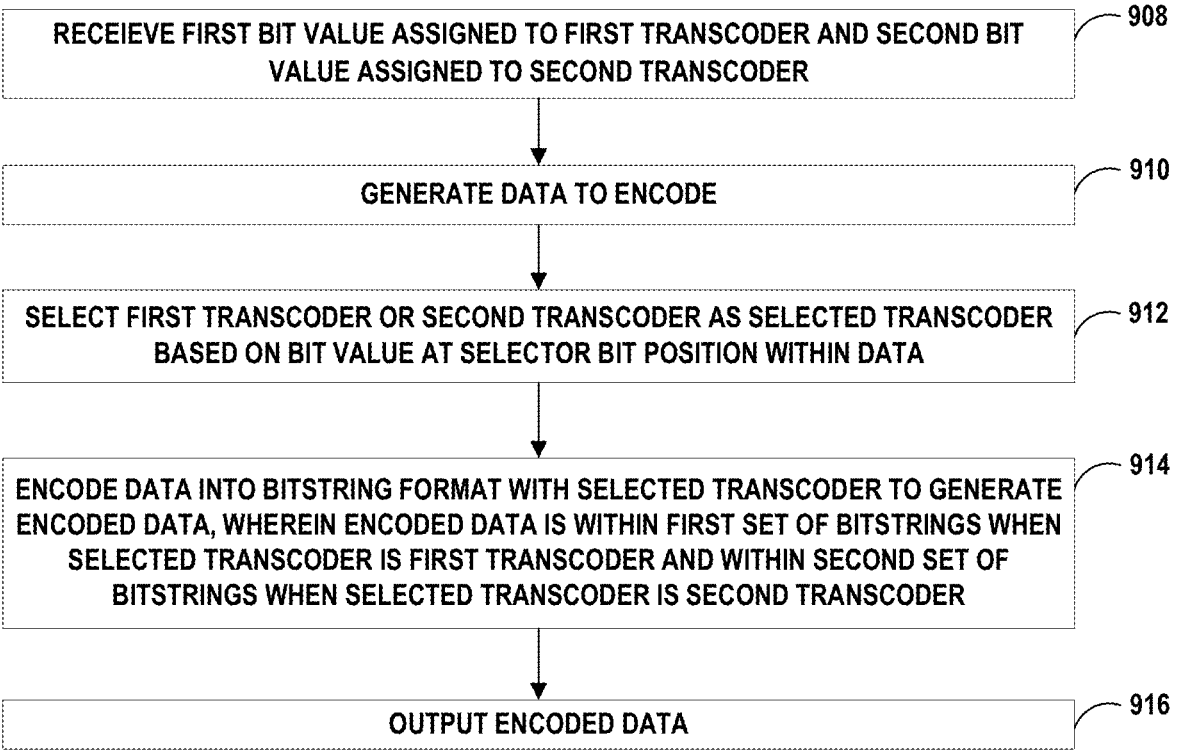

RECEIEVE FIRST BIT VALUE ASSIGNED TO FIRST TRANSCODER AND SECOND BIT VALUE ASSIGNED TO SECOND TRANSCODER    908

GENERATE DATA TO ENCODE    910

SELECT FIRST TRANSCODER OR SECOND TRANSCODER AS SELECTED TRANSCODER BASED ON BIT VALUE AT SELECTOR BIT POSITION WITHIN DATA    912

ENCODE DATA INTO BITSTRING FORMAT WITH SELECTED TRANSCODER TO GENERATE ENCODED DATA, WHEREIN ENCODED DATA IS WITHIN FIRST SET OF BITSTRINGS WHEN SELECTED TRANSCODER IS FIRST TRANSCODER AND WITHIN SECOND SET OF BITSTRINGS WHEN SELECTED TRANSCODER IS SECOND TRANSCODER    914

OUTPUT ENCODED DATA    916

FIG. 9B

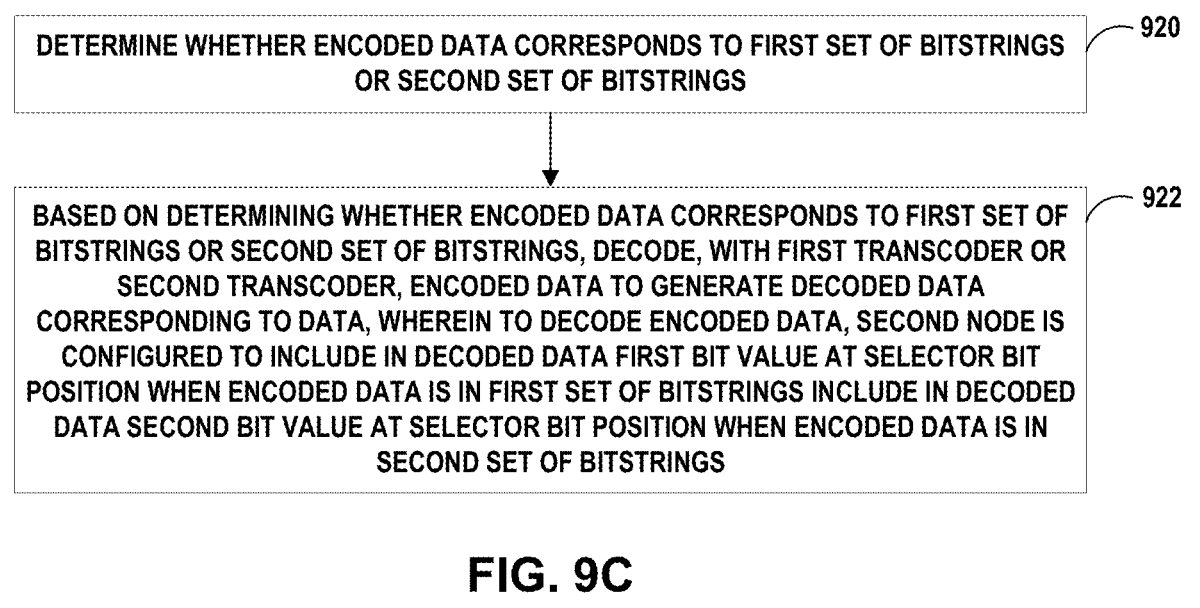

DETERMINE WHETHER ENCODED DATA CORRESPONDS TO FIRST SET OF BITSTRINGS OR SECOND SET OF BITSTRINGS ⌐ 920

BASED ON DETERMINING WHETHER ENCODED DATA CORRESPONDS TO FIRST SET OF BITSTRINGS OR SECOND SET OF BITSTRINGS, DECODE, WITH FIRST TRANSCODER OR SECOND TRANSCODER, ENCODED DATA TO GENERATE DECODED DATA CORRESPONDING TO DATA, WHEREIN TO DECODE ENCODED DATA, SECOND NODE IS CONFIGURED TO INCLUDE IN DECODED DATA FIRST BIT VALUE AT SELECTOR BIT POSITION WHEN ENCODED DATA IS IN FIRST SET OF BITSTRINGS INCLUDE IN DECODED DATA SECOND BIT VALUE AT SELECTOR BIT POSITION WHEN ENCODED DATA IS IN SECOND SET OF BITSTRINGS ⌐ 922

FIG. 9C

STORAGE AND COMMUNICATING BITS OF INFORMATION IN COMPOSITE CLASSES OF VALID DATA

This application claims the benefit of U.S. Provisional Application No. 63/465,757 filed on May 11, 2023, the entire content of which is incorporated herein by reference.

GOVERNMENT RIGHTS

This invention was made with Government support under Contract FA8650-14-C-7438 awarded by the Defense Advanced Research Project Agency (DARPA). The Government has certain rights in the invention.

TECHNICAL FIELD

This disclosure generally relates to computing systems.

BACKGROUND

In a flow of information encoded in different data formats, some bits are not used. For example, valid data for a given message format may only partially fill certain fields or just fill relevant fields.

SUMMARY

In general, the disclosure describes techniques for storing or communicating bits of information in composite classes of valid data. For a given computing system, not every sequence of bits necessarily constitutes valid data. The disclosed techniques are directed to storing of bits of information as valid data, given a notion of data validity that is imposed, for instance, by the computing system used for storage. For example, valid data may be data (e.g., a bitstring) that satisfies validity requirements, (e.g., validity constraints), of a bitstring format and a class of valid data may be a group of valid data (e.g., a group of bitstrings). In accordance with the disclosed techniques, a system may find disjoint classes of valid data, such as in an iterative process, and create composite classes from those that are found. These composite classes of valid data may be used to generate transcoders that may encode/decode the theoretical number of possible bits of information as valid data of one or more given bitstring formats.

The system may perform various techniques for identifying classes of data, where a class is characterized by some fixed bits having values (e.g., "0" or "1") that are fixed with the remaining bits being free bits having values that may be set freely. After every iteration, the system may pack bits of information as valid data (e.g., encode bits of information), as well as reverse such packing (e.g., decode encoded data) to unpack valid data as bits of information. The more composite classes are created, by the system executing more iterations of the technique, the more bits of information can be packed (e.g., compressed) within the same number of bits as valid data (e.g., the denser the packing).

In some cases, the number of free bits found may be smaller than the theoretical number of bits that can be encoded as a bitstring value that satisfies the validity constraint, which leads to a non-optimal encoding that may waste storage space or communication bandwidth. The system of the disclosed techniques may provide an optimal solution to the problem by generating a transcoder that can store/retrieve as many bits of data as is theoretically possible. Technically, if there are 'n' number of solutions to the bitstring constraint, where 'n' is a positive integer greater than zero, there are theoretically floor(log 2(n)) bits of data that can be stored as one of the n solutions. The iterative identification of disjoint classes of valid data and creation of composite classes of valid data based on the disjoint classes may encode/decode as many bits of data as theoretically possible (as in the above floor(log 2(n) formula) when the system is allowed to run the iterations to completion. In some examples, the system may be interrupted at any time, such as to avoid excessive use of computing resources, and create composite classes of valid data with the disjoint classes of valid data found before being interrupted. In such case, the number of bits that can be stored may still be improved through the composite class(es) even though the system has been interrupted.

In one example, a system includes a storage device storing an indication of a bitstring format and processing circuitry configured to determine, based on the bitstring format, a first set of bitstrings for a first transcoder, determine, based on the bitstring format, a second set of bitstrings for a second transcoder, wherein no bitstring of the first set of bitstrings matches a bitstring of the second set of bitstrings, and output an indication of a first bit value assigned to the first transcoder and a second bit value assigned to the second transcoder.

In another example, a method includes determining, by processing circuitry and based on a bitstring format, a first set of bitstrings for a first transcoder, determining, by the processing circuitry and based on the bitstring format, a second set of bitstrings for a second transcoder, wherein no bitstring of the first set of bitstrings matches a bitstring of the second set of bitstrings, and outputting, by the processing circuitry, an indication of a first bit value assigned to the first transcoder and a second bit value assigned to the second transcoder.

In another example, non-transitory computer-readable media is disclosed, the non-transitory computer-readable media comprising instructions that, when executed, cause processing circuitry to determine, based on a bitstring format, a first set of bitstrings for a first transcoder, determine, based on the bitstring format, a second set of bitstrings for a second transcoder, wherein no bitstring of the first set of bitstrings matches a bitstring of the second set of bitstrings, and output an indication of a first bit value assigned to the first transcoder and a second bit value assigned to the second transcoder.

The details of one or more examples of the techniques of this disclosure are set forth in the accompanying drawings and the description below. Other features, objects, and advantages of the techniques will be apparent from the description and drawings, and from the claims.

3

Figure 4:
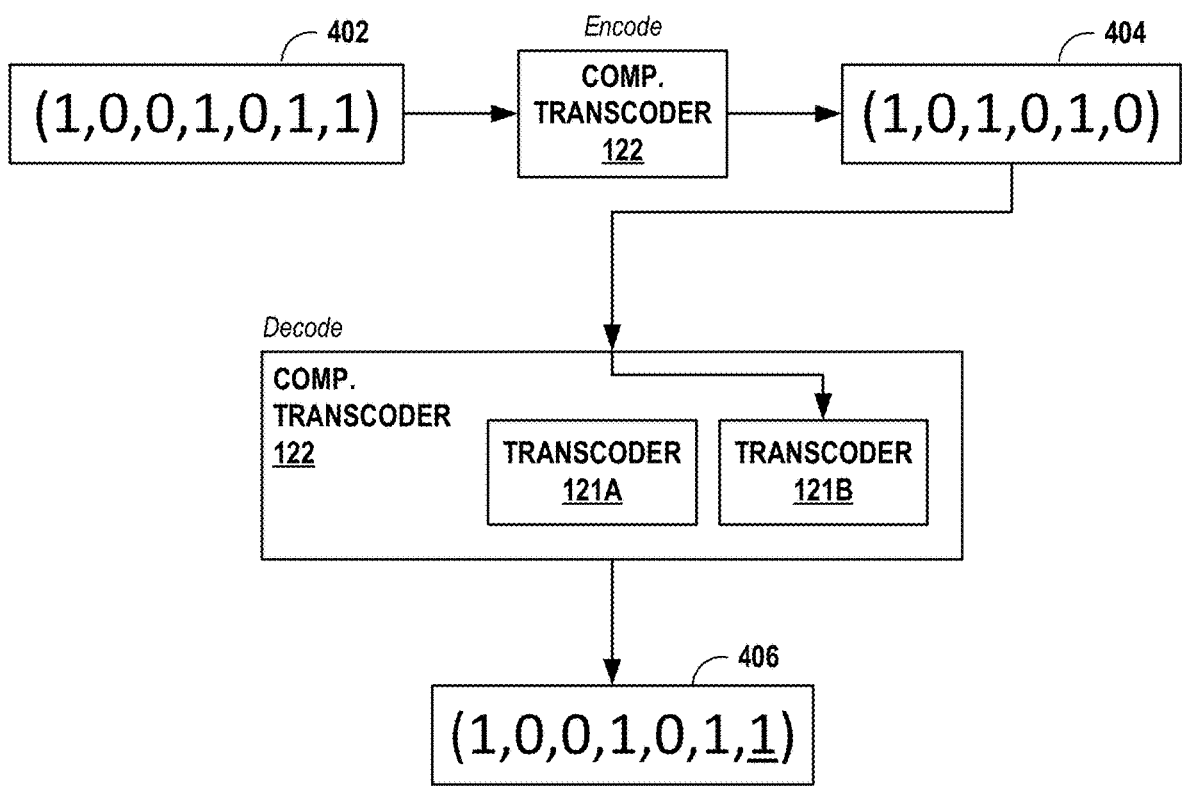

FIG. 4 is a block diagram illustrating a first example process of a system for storing and communicating bits of information in composite classes of valid data, in accordance with the techniques of the disclosure.

Figure 5:
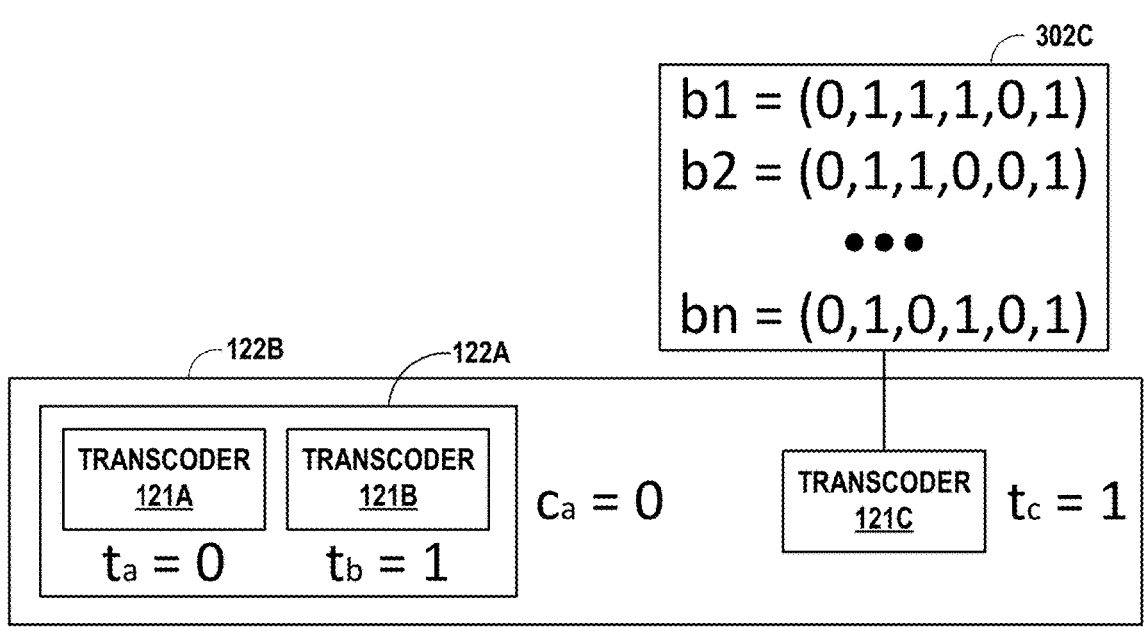

FIG. 5 is a block diagram illustrating a second example of transcoders for storing and communicating bits of information in composite classes of valid data, in accordance with the techniques of the disclosure.

Figure 6:
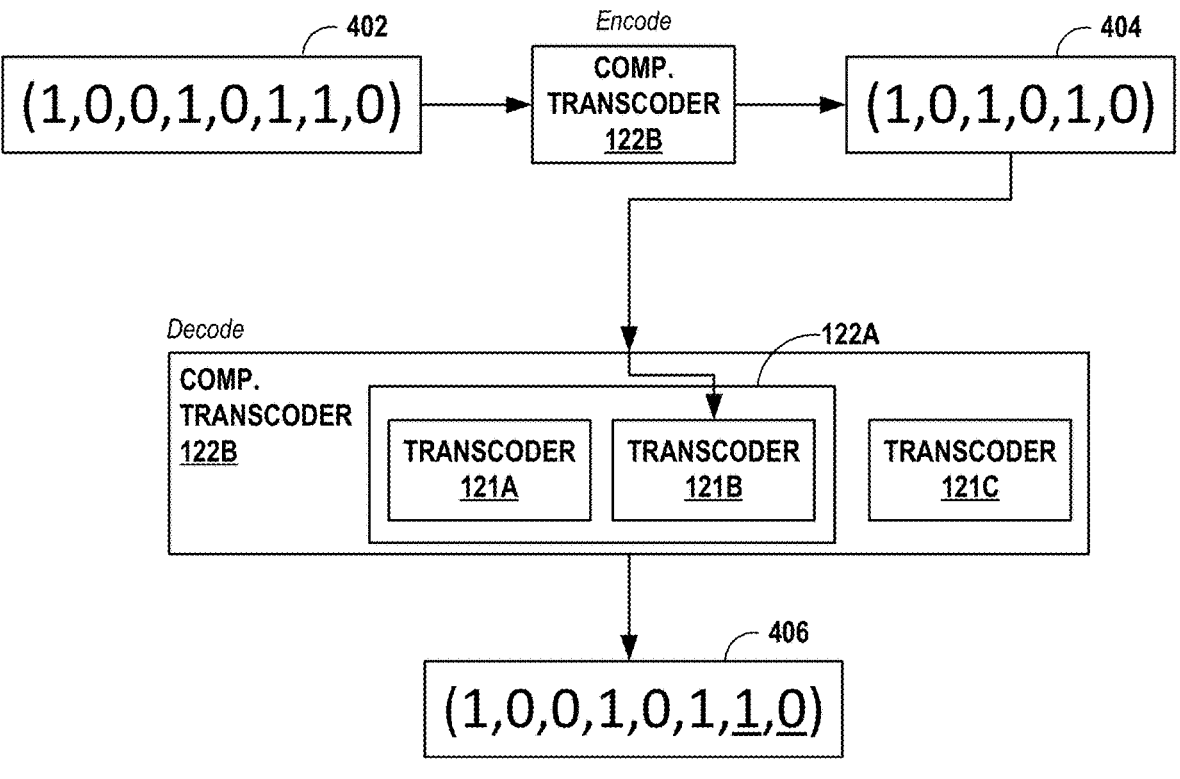

FIG. 6 is a block diagram illustrating a second example process of a system for storing and communicating bits of information in composite classes of valid data, in accordance with the techniques of the disclosure.

Figure 7:
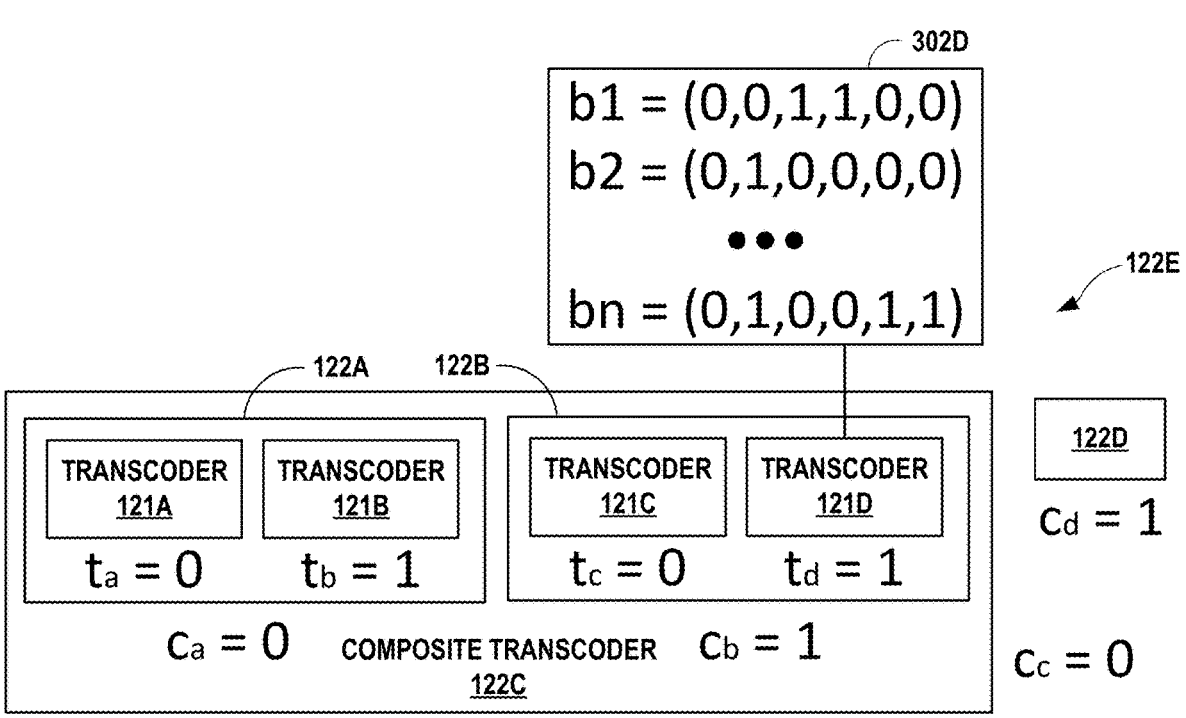

FIG. 7 is a block diagram illustrating a third example of transcoders for storing and communicating bits of information in composite classes of valid data, in accordance with the techniques of the disclosure.

Figure 8:
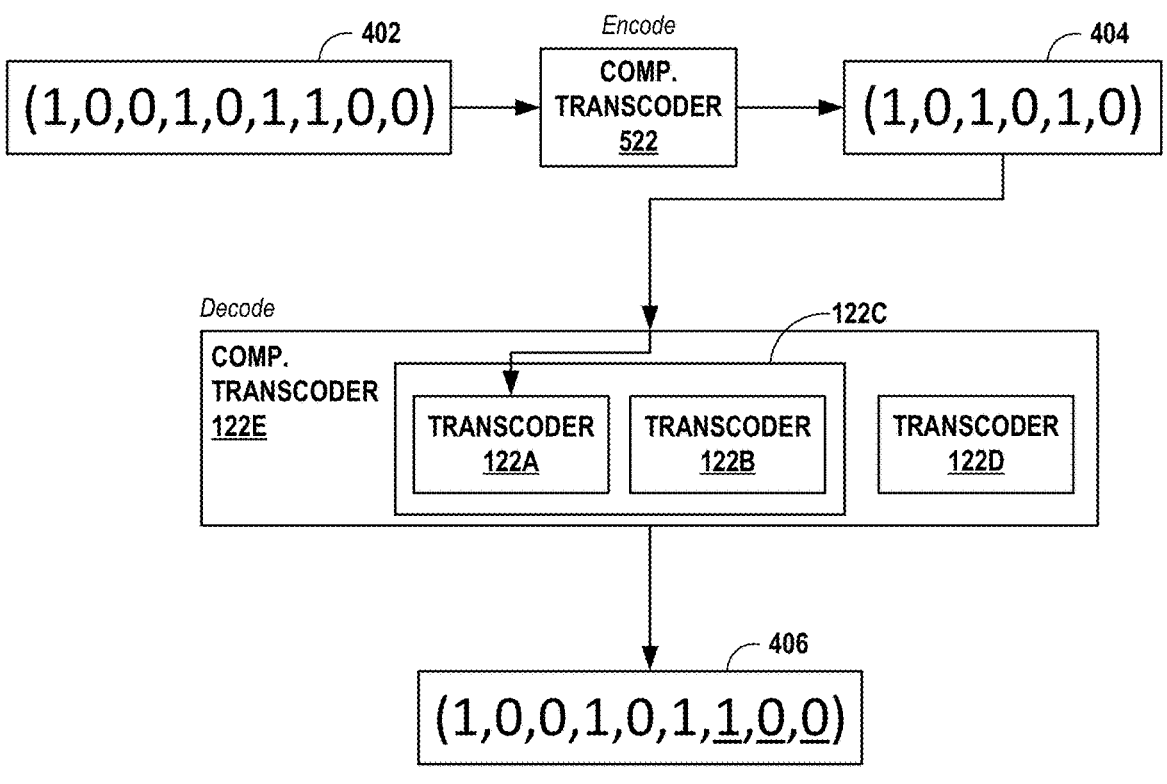

FIG. 8 is a block diagram illustrating a third example process of a system for storing and communicating bits of information in composite classes of valid data, in accordance with the techniques of the disclosure.

FIG. 9A is a flow chart illustrating a first example process for storing and communicating bits of information in composite classes of valid data, in accordance with the techniques of the disclosure.

FIG. 9B is a flow chart illustrating a second example process for storing and communicating bits of information in composite classes of valid data, in accordance with the techniques of the disclosure.

FIG. 9C is a flow chart illustrating a third example process for storing and communicating bits of information in composite classes of valid data, in accordance with the techniques of the disclosure.

Figure 10:
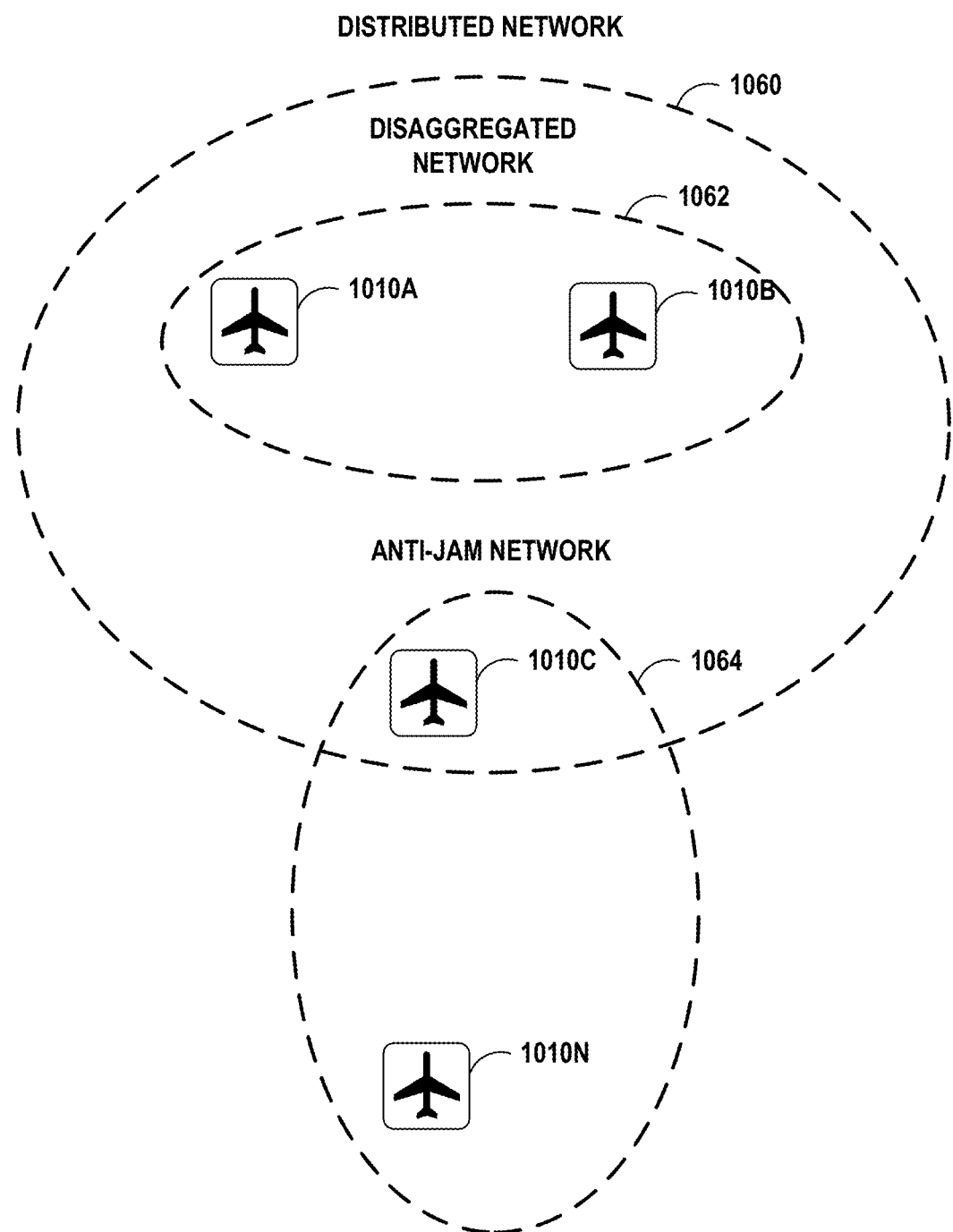

FIG. 10 is a conceptual diagram illustrating a first example use case, in accordance with the techniques of the disclosure.

Figure 11:
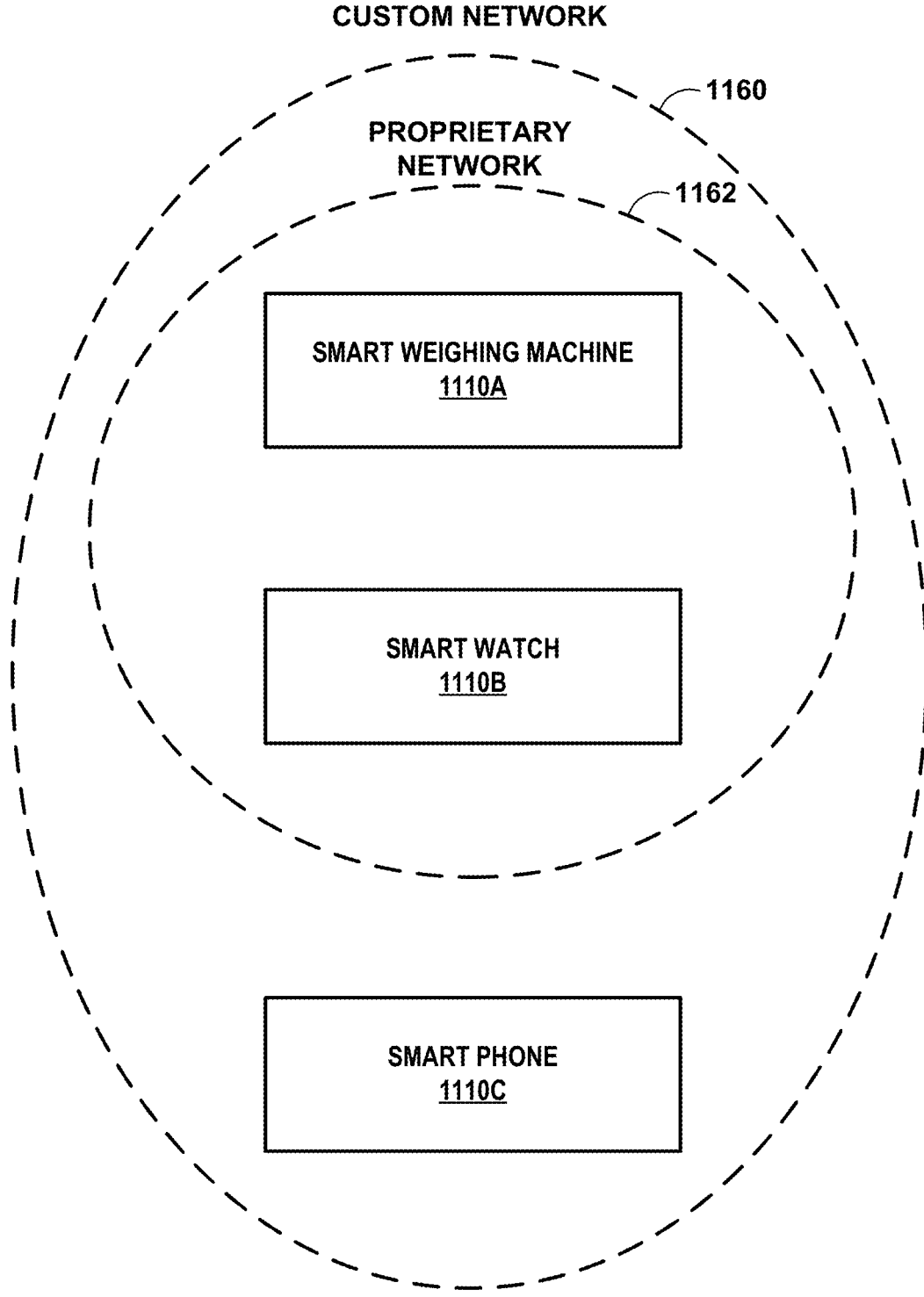

FIG. 11 is a conceptual diagram illustrating a second example use case, in accordance with the techniques of the disclosure.

Figure 12:
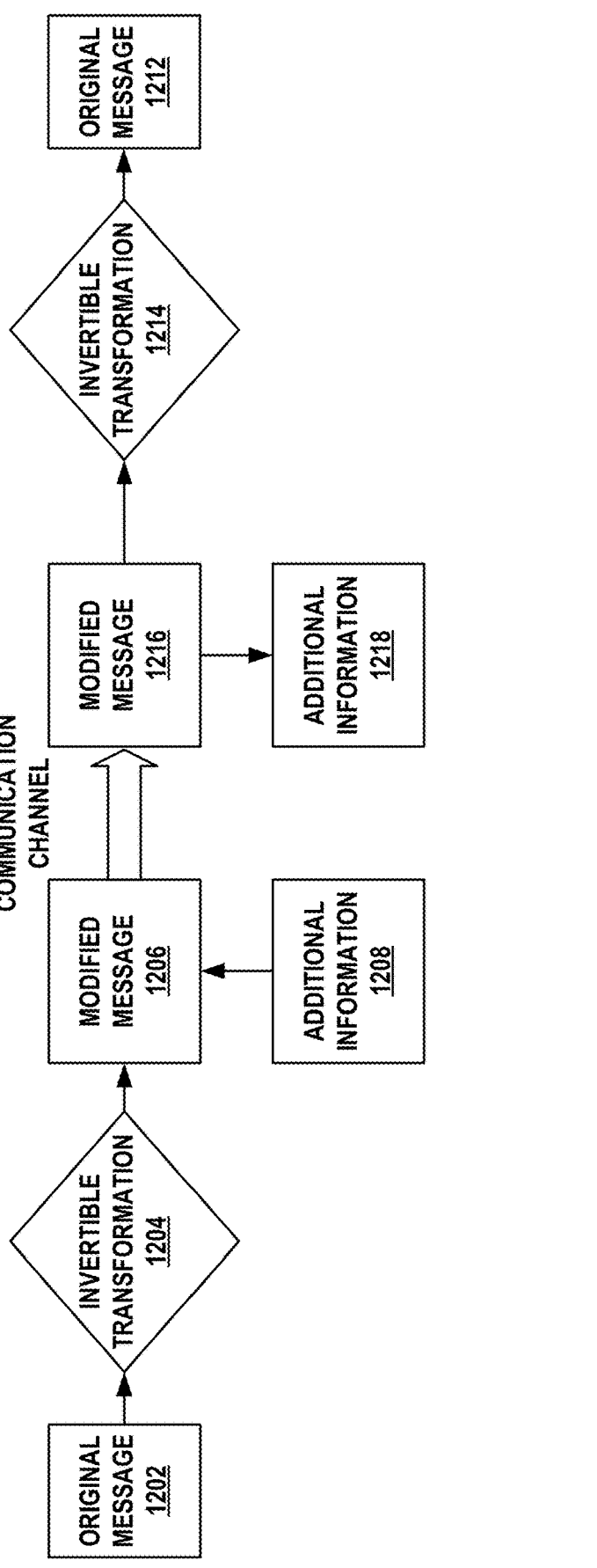

FIG. 12 is a conceptual diagram illustrating a third example use case, in accordance with the techniques of the disclosure.

Like reference characters refer to like elements throughout the figures and description.

DETAILED DESCRIPTION

This disclosure describes inventive concepts with reference to specific examples. However, the intent is to cover all modifications, equivalents, and alternatives of the inventive concepts that are consistent with this disclosure. It will be apparent, however, to one of ordinary skill in the art that the present approach can be practiced without these specific details. Thus, the specific details set forth are merely exemplary, and is not intended to limit what is presently disclosed. The features implemented in one embodiment may be implemented in another embodiment where logically possible. The specific details can be varied from and still be contemplated to be within the spirit and scope of what is being disclosed.

In accordance with the techniques of the disclosure, a system may store or communicate bits of information in composite classes of valid data. The system may provide an optimal solution whereby as many bits as theoretically possible may be stored through use of the composite classes. Various computing systems may have a variety of requirements for valid data within the system, for example, to store data. A class of valid data may be characterized as having some bits with 0/1 values that are fixed while the remaining bits may be set freely. The system may iteratively execute (e.g., loop) one or more techniques for identifying classes of valid data to find classes of valid data that are disjoint. The system may generate composite classes of valid data from a plurality of disjoint classes of valid data. The more composite classes that are created, such as by executing additional iterations, the more bits of information may be stored as valid data (e.g., denser packing of bits).

Some systems of systems (SoS) may use a first protocol for communications between a first system and a second system and a second protocol for communications between the second system and a third system. To exchange data between the first system and the third system via the second system, the first system, the second system, and the third system may each be configured to support a single protocol (e.g., the first protocol or the second protocol). However, such systems do not scale well as each system must be configured to support the single protocol. Alternatively, the first system may be configured to support both the first protocol and the second protocol such that data transmitted to the second system is compliant with both the first protocol and the second protocol. However, such systems do not scale well because each protocol of the system of systems must be supported by all systems of the system of systems.

Techniques described herein may help to allow systems of systems to communicate using one or more free bits that satisfy a bitstring format for the set of systems. For example, a system of systems may be configured to use a first protocol for communications between a first system and a second system and a second protocol for communications between the second system and a third system. In this example, the first system may be configured to use free bits to exchange data to the third system via the second system. In this way, techniques described herein may help to automatically construct transcoders and composite transcoders that enable transmission of data over existing channels without knowledge of various protocols supported by each system, which may improve a data throughput of the system of systems. Benefits to the use of free bits can be further improved by the described techniques, by storing an optimal number of bits of data in the available free bits through the use of composite classes.

The techniques include the encoding of bits of data as a value in a given set. A set with 8 values allows the encoding of 3 bits of data as one of the 8 values. A set with 16 values allows the encoding of 4 bits of data as one of the 16 values. The techniques also include decoders that can convert a value back into the bits of data that were encoded and concerns the case when the set of values is described as a set of bitstring values that satisfy a symbolic constraint, for instance "the set of all 32-bit integers between 13 and 56 that are odd."

Figure 1:
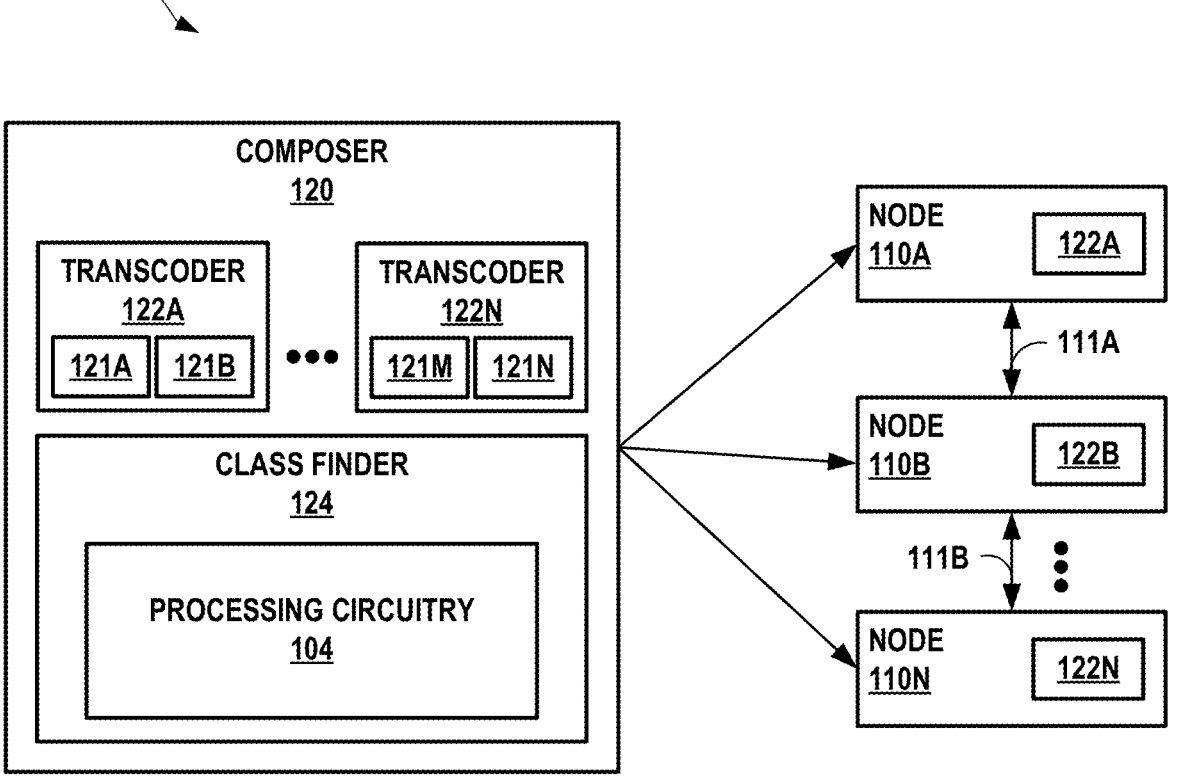
FIG. 1 is a block diagram illustrating an example system for storing and communicating bits of information in composite classes of valid data, in accordance with the techniques of the disclosure.

FIG. 1 is a block diagram illustrating an example system 100 for storing bits of information in composite classes of valid data, in accordance with the techniques of the disclosure. As shown, system 100 may include composer 120, transcoders 121A-121N (collectively, "transcoders 121"), composite transcoders 122A-122N (collectively, "composite transcoders 122"), class finder 124 and nodes 110A-110N (collectively, "nodes 110"). System 100 is for example purposes only. For example, system 100 may include additional or fewer components. Composer 120, transcoders 121, composite transcoders 122, and class finder 124 may be software stored on a non-transitory storage medium that is executable by one or more processors or processing circuitry, or may be implemented or embedded in processing circuitry. As will be described further below, composite transcoder 122 may include various combinations of transcoders 121 as well as other composite transcoders 122.

Composer 120 may generate composite classes of valid data from a plurality of disjoint classes of valid data determined by class finder 124. To find a class of valid data, composer 120 may run (e.g., execute) class finder 124 to determine one or more free bits of a bitstring format where the remaining bits may be fixed bits. As used herein, a free bit may refer to a bit that can be repurposed to enable new communication modes. For example, a free bit may be a bit of a bitstring format that is not used for a protocol defining a bitstring format of the bitstring. As another example, a free bit may be a bit of a bitstring format that is not used for a storage rule of the bitstring. A free bit may be a bit of a bitstring format that corresponds to an unused field of a message format, for instance. In contrast, a fixed bit may refer to a bit that cannot be repurposed (e.g., to enable new communication modes or to enable new storage rules for a storage format). For example, a fixed bit may refer to a bit of a bitstring format that is used by a protocol and that must have a particular value in a bitstring in order for that bitstring to be an acceptable bitstring of the bitstring format. For example, a fixed bit may refer to a bit of a bitstring format that is used by a storage rule and that must have a particular value in a bitstring in order for that bitstring to be an acceptable bitstring of the bitstring format. A fixed bit may be a bit of a bitstring format that corresponds to a used field of a message format, for instance. Some example techniques which may be executed by class finder 124 are described in "IDENTIFYING FIXED BITS OF A BITSTRING FORMAT," U.S. Pat. No. 11,423,247, filed Apr. 3, 2020, the entire contents of which are hereby incorporated by reference.

Technically, if there are n solutions to a bitstring constraint, there are theoretically floor(log 2(n)) bits of data that can be stored as one of the n solutions. Composer 120 may perform an iterative process (e.g., a loop) that may be interrupted at any time to iteratively generate an improved transcoder (e.g., a composite transcoder that can store (e.g., encode) more bits in composite classes of valid data). For example, composer 120 may perform a first iteration to generate a transcoder that can pack (e.g., encode) n number of bits, and perform subsequent iteration(s) of the loop to improve the transcoder such that the transcoder can encode one or more additional bits. If composer 120 runs the iteration until completion (e.g., for all possible combination of bits), the final transcoder can encode/decode as many bits of data as is theoretically possible (as in the floor(log 2(n) formula above).

A class finder 104 may select an initial bitstring. The selection of an initial bitstring for finding classes of valid data may, in some cases, cause far less than the theoretically possible number of bits to be found. To address the issue, composer 120 executes class finder 124 iteratively, where each iteration may start from a different bitstring u. Composer 120 may select the class of valid data that includes the largest number of free bits to generate a transcoder 121. Such iterative strategy can significantly improve a resulting transcoder (e.g., find a few hundred more free bits as compared to a non-iterative process). In this iterative form, composer 120 may just keep the best result (e.g., the transcoder 121 that can encode/decode the most bits) among several iterations and discard the others.

In some examples, composer 120 does not discard the results (e.g., classes of valid data) of iterations of class finder 124 that do not provide the highest number of free bits, and instead composes (some of) them, so that the resulting composite classes of valid data and composite transcoders 122 may encode more free bits than those individually produced by the iterations. For example, a first iteration of class finder 124 for a field F may find 42 free bits. This means that class finder 124 has found a set $C_1$ of $2^{\wedge}42$ bitstrings (e.g., a class of valid data) that satisfy P. Class finder 124 may run again but with a strengthened property to force bitstrings to satisfy P but be outside of $C_1$ (e.g., solutions disjoint from $C_1$). For example, this may replace P(x) with P(x) &&¬$C_1$ (x) in the algorithm. If the second iteration also finds 42 free bits, there is a new solution set $C_2$ of $2^{\wedge}42$ bitstrings that satisfy P, and the two sets $C_1$ and $C_2$ are disjoint.

Composer 120 may generate a transcoder 121A $T_1$ built from $C_1$ that can use 42 free bits to encode data. For example, composer 120 may generate a transcoder 121A having the output set of $C_1$. Composer 120 may generate transcoder 121B $T_2$ built from $C_2$ (e.g., having the output set of $C_2$) that can store 42 bits of data. Composer 120 may combine $C_1$ and $C_2$ into a composite class of valid data and/or $T_1$ and $T_2$ in a composite transcoder 122A that encodes/decodes an extra free bit. The input to composite transcoder 122A may be an array of 43 bits. Composite transcoder 122A may use one of these bits (e.g., bit 43) as a selector. For example, if the selector bit is one, transcoder 121A $T_1$ may encode the remaining 42 input bits and, otherwise, transcoder 121B $T_2$ may encode the remaining 42 bits. In some examples, by construction, transcoder 121A $T_1$ produces a bitstring that belongs to $C_1$ and transcoder 121B $T_2$ produces a bitstring in set $C_2$. Composite transcoder 122A relies on the fact that $C_1$ and $C_2$ are disjoint. Given a field element x (e.g., a given bitstring), composite transcoder 122 may check whether x belongs to $C_1$ or to $C_2$. In the first case, composite transcoder 122 decodes 42 data bits by applying the decoder of transcoder 121A $T_1$ and sets bit 43 to 1. Otherwise, composite transcoder 122 obtains 42 bits by applying the decoder of transcoder 121B $T_2$ and sets bit 43 to 0.

To decode encoded data x (e.g., an encoded bitstring), composite transcoder 122 may determine whether x belongs to $C_1$ or to $C_2$. To determine whether x belongs to $C_1$ or to $C_2$, composite transcoder 122 may distinguish between $C_1$ or $C_2$ by comparing or analyzing one or more bits of x. For example, composite transcoder 122 may include a Binary Decision Diagram (BDD) that can be implemented in the domain specific language (DSL) for programming or writing transcoders with a nesting of if-then-else constructs (e.g., conditional steps/statements). Composite transcoder 122 ($T_1+T_2$) can be further combined with any other transcoder 121 or composite transcoder 122 that has 43 free bits. By running many iterations of class finder 124, composer 120 may generate a population of classes of valid data and transcoders 121 with different numbers of free bits. Composer 120 may combine any two of such transcoders 121 into respective composite transcoders 122 as long as the component transcoders 121 (e.g., a pair of transcoders 121, a pair of composite transcoders 122, or a pair of one transcoder 121 and one composite transcoder 122) have the same number of free bits and recursively combine the resulting composed transcoder (e.g., the resulting composite transcoder 122) with other transcoders 121, 122 in the population. When composer 120 stops iterating class finder 124, composer 120 may retain generated composite transcoders 122 with the highest number of free bits. It can be shown that the total number of free bits in this last composite transcoder 122 does not depend on the order in which the system did the combinations.

The iterative processes executed by composer 120, as described above, may be theoretically optimal. When run to completion (assuming no timeouts or other resource exhaustion), composer 120 may produce composite transcoder 122 whose number of free bits matches the theoretical optimum, namely, [log 2 (#solutions of P)]. As convergence may take a long time and the size of the DSL expressions defining the transcoder (e.g., defining an encoder and decoder of the transcoder) may grow large, limits can be put on the number of iterations and solve time, which the user can customize with user instructions/input (e.g., command-line options). To further limit the growth of DSL expressions in the composite transcoders, in some examples, there can be numerous rewriting and simplification techniques. For instance, composer 120 may detect and factor out identical sub-expressions in transcoder components.

As described herein, class finder 124 can run iteratively (e.g., repeatedly), each time with an increasingly strong bitstring constraint; the transcoders 121 (e.g., encoder/decoder pairs) produced by each iteration may be enforced, such as by composer 120, to output disjoint classes of valid data (e.g., disjoint sets of bitstring values). When two transcoders 121 produced by two runs can encode exactly the same number of bits, such as a positive integer i number of bits (meaning they use two disjoint sets of 2&&i bitstring values), then composer 120 may combine such transcoders 121 into a composite transcoder 122 that can encode (i+1) values (using 2&&i+2&&i=2&& (i+1) bitstring values). Composite transcoders 122 may be stored to a data store (e.g., database, file, memory) at a storage device, keeping for each possible number i of data bits, either zero or one transcoder 122 that can encode i bits; every time a new pair is entered in the database, composer 120 may execute a process similar to the carry propagation of binary addition to combine the transcoder pairs that may form a composite transcoder 122. After composer 120 generates and stores the last pair (e.g., the last composite transcoder 122), composer 120 may identify the transcoder pair in the data store that can encode the greatest number of bits as the optimal transcoder 122. As a result, more bits of data can be encoded into free bits of a bitstring format. If the encoded bits of data were to be sent on a communication channel, then in order to convey a given number of data bits to a recipient, a shorter message would be sent, transmitting the information more quickly.

In operation, composer 120 may receive classes of valid data from class finder 124. For example, class finder 124 may communicate classes of valid data to composer 120 as class finder 124 finds the classes of valid data. Composer 120 may determine whether a class of valid data is disjoint from other classes of valid data received from class finder 124. In some examples, a class of valid data may be characterized by a set of bitstrings, having one or more free bits, that each constitute valid data for a bitstring format. Disjoint classes of valid data may be characterized as sets of bitstrings that are disjoint (e.g., having no elements in common) from one another. If defined as expressions, disjoint classes of valid data may be characterized as expressions that output a set of bitstrings that are disjoint (e.g., having no elements in common).

Composer 120 may generate one or more composite classes of valid data by associating a pair (e.g., two) disjoint classes of valid data. For example, composer 120 may store an indication, such as in a data store, that a first class of valid data and a disjoint second class of valid data constitute a particular composite class of valid data. Composer 120 associates the first class of valid data and the disjoint second class of valid data with the particular composite class of valid data in this manner. Composer 120 may similarly generate one or more composite classes of valid data by associating a pair of composite classes of valid data or a composite class of valid data and a class of valid data. For example, composer 120 may store an indication in the data store that the component classes (e.g., a pair of composite classes of valid data or a composite class of valid data and a class of valid data) constitute a composite class of valid data. In some examples, composer 120 may only generate a composite class with component classes that have the same number of free bits (e.g., 42 bits).

In the example of FIG. 1, composer 120 includes class finder 124 and processing circuitry 104. Though shown within composer 120, in some examples, class finder 124 may be a separate element external to composer 120 that is in communication with composer 120. In such case, class finder 124 may include its own processing circuitry. Processing circuitry 104 may include any one or more of a microprocessor, a controller, a digital signal processor (DSP), an application specific integrated circuit (ASIC), a field-programmable gate array (FPGA), or equivalent discrete or integrated logic circuitry.

Each of nodes 110 may include processing circuitry that generates bits of a bitstring format. Each of nodes 110 may be, for instance, a controller, a computer, a sensor, an appliance, or a mobile device. Nodes 110 may be components of a larger system, such as a computing device (e.g., a controller, a computer, a sensor, an appliance, or a mobile device), vehicle, or distributed computing system. Processing circuitry of nodes 110 may include one or more of a microprocessor, a controller, a DSP, an ASIC, an FPGA, or equivalent discrete or integrated logic circuitry. In some examples, nodes 110 may comprise component circuitry (e.g., processing, logic or other units) of one or more of a microprocessor, a controller, a DSP, an ASIC, an FPGA, or equivalent discrete or integrated logic circuitry.

Nodes 110 may communicate to each other over communication links according to a communication protocol, such through one or more protocol sessions 111A-111B (collectively, "protocol sessions 111"). For example, node 110A may communicate with node 110B using protocol session 111A. Node 110B may communicate with node 110C using protocol session 111B. Protocols sessions 111 may operate according to well-defined message formats.

Composer 120 may generate transcoders 121 and composite transcoders 122 based on one or more classes of valid data and one or more composite classes of valid data, respectively. Transcoders 121 and composite transcoders 122 may enable transmission of data over existing channels (e.g., protocol sessions 111). As described above, composite classes of valid data allow composite transcoders 122 to encode an extra bit of information (e.g., a pair of composite classes of valid data with 42 free bits may be used to generate transcoder 122 that encodes 43 bits). Composite transcoder 122 may encode data in one or more free bits of the protocol (e.g., bitstring format) of protocol sessions 111. Composer 120 may distribute or transmit one or more composite transcoders 122, or indications thereof, to nodes 110. In this manner, node 110A may, through composite transcoder 122A, include data in free bits of a message according to a first protocol to be received by node 110B using protocol session 111A. In this example, node 110B can include data in free bits, such as according to a second protocol, to be received by node 110N using protocol session 111B. In this way, node 110A may output data to node 110N using existing protocols operating between nodes 110.

In accordance with the disclosed techniques, processing circuitry 104 may generate or receive a plurality of classes of valid data through iterative runs of class finder 124. For example, processing circuitry 104 may generate or receive a first class of valid data having first free bits from a first iteration of class finder 124 and a second class of valid data having second free bits from a second iteration of class finder 124. For instance, class finder 124 may determine that bitstrings having the format [-, -, 1, -], where each "-" represents a free bit and "1" represents a required fixed bit value of one, satisfy the bitstring format (e.g., are valid bitstrings in the bitstring format). Processing circuitry 104 may determine whether the first class of valid data and the second class of valid data are disjoint. For example, the first class of valid data may be the set of bitstrings beginning with a "1" that satisfy the bitstring format (e.g., bitstrings of the format [1, X, 1, X], where "X" may be "0" or "1") and the second class of valid data may be the set of bitstrings beginning with a "0" that satisfy the bitstring format (e.g., bitstrings of the format [0, X, 1, X], where "X" may be "0" or "1"). In such case, processing circuitry 104 may determine the first class of valid data and the second class of valid data are disjoint for the reason that the classes (e.g., sets of bitstrings) have no bitstrings in common.

Processing circuitry 104 may determine that classes of valid data are not disjoint. For example, processing circuitry 104 may generate or receive, from a third iteration, a third class of valid data that is the set of bitstrings of the format [X, X, 1, 0], where "X" may be "0" or "1". Processing circuitry 104 may determine the third class of valid data is not disjoint from the first class of valid data in that some bitstrings (e.g., [1, 0, 1, 0]) are common between the two classes. Processing circuitry 104 may determine the third class of valid data is not disjoint from the second class of valid data in that some bitstrings (e.g., [0, 0, 1, 0]) are common between these two classes. Processing circuitry 104 may refrain from using a class of valid data that is not disjoint to generate composite transcoder 122.

With a pair of disjoint classes of valid data (e.g., the first and second class of valid data), processing circuitry 104 may generate a composite class of valid data that includes both disjoint classes of valid data. For instance, processing circuitry 104 may create a composite class of valid data by associating the first class of valid data and the second class of valid data with a composite class of valid data. For example, processing circuitry 104 may store respective identifiers of the first class of valid data, the second class of valid data, and the composite class of valid data which they form, together in a record, such as on a storage device.

Processing circuitry 104 may generate composite transcoder 122A from a composite class of valid data. For example, the first class of valid data and the disjoint second class of valid data may both have 42 free bits. Processing circuitry 104 may accordingly generate a first transcoder 121A with the first class of valid data that encodes 42 bits and a second transcoder 121B with the second class of valid data that encodes 42 bits. Processing circuitry may combine first transcoder 121A and second transcoder 121B into composite transcoder 122A that can encode an extra bit, or 43 bits in this example. To encode a bitstring of 43 bits, processing circuitry 104 may select one bit of the data to be encoded as a selector bit and use the selector bit to select one transcoder 121 of composite transcoder 122. For example, when the selector bit is a "1" processing circuitry may encode the remaining 42 bits with first transcoder 121A and when the selector bit is a "0" processing circuitry 104 may encode the remaining 42 bits with second transcoder 121B.

To decode an encoded bitstring, processing circuitry 104 may rely on the characteristic that the first class of valid data and the second class of valid data are disjoint. As such, processing circuitry 104 may determine, based on the encoded data (e.g., encoded bitstring), a disjoint class of valid data to which the bitstring belongs. For example, processing circuitry 104 may determine whether the encoded bitstring is in the first class of valid data or the second class of valid data. Processing circuitry 104 may execute transcoder 121 associated with the determined class of valid data (e.g., the transcoder 121 with an output set of the class of valid data) to decode the encoded data. Continuing the above example for instance, processing circuitry 104 may determine the encoded bitstring belongs to the first class of valid data and decode the encoded bitstring with first transcoder 121A and set the bit at the position of the selector bit to "1." Likewise, when processing circuitry 104 determines the encoded bitstring belongs to the second class of valid data, processing circuitry 104 may decode the encoded data with second transcoder 121B and set the bit at the position of the selector bit to "0." As can be seen, by decoding the encoded data and setting the selector bit the original 43 bits of data may be restored (e.g., decoded).

As can be seen, each node 110 may include processing circuitry 104 that encodes data using composite classes of valid data, decodes encoded data, or both. While the foregoing examples use particular numbers of bits, other examples may use fewer bits or more bits. Moreover, while the example of FIG. 1 used a protocol format other bitstring formats may be used, for example, processing circuitry 104 may be configured to identify free bits and/or fixed bits for of one or more storage rules for a storage system.

Techniques described herein may help to allow nodes 110, which may be each configured for different protocols to communicate. For example, rather than relying on configuring each node of nodes 110 with a particular protocol or relying on configuring each node of nodes 110 with all of the protocols used by nodes 110 to allow communication between each node of nodes 110, techniques described herein may configure each node of nodes 110 to communicate using one or more free bits identified by processing circuitry 104 that satisfy a bitstring format for nodes 110. In this way, techniques described herein may help to automatically construct transcoders that enable transmission of data over protocol sessions 111, which may improve a data throughput of communications between nodes 110.

Techniques described herein may be used to optimize data transmission in free bits over a communication channel. For example, nodes 110 may be configured to store bits of data in composite classes of valid data to optimize the number of bits that can be encoded in the free bits for transmission on protocol sessions 111 to an original message. In this way, techniques described may improve a data throughput of system 100.

Figure 2:
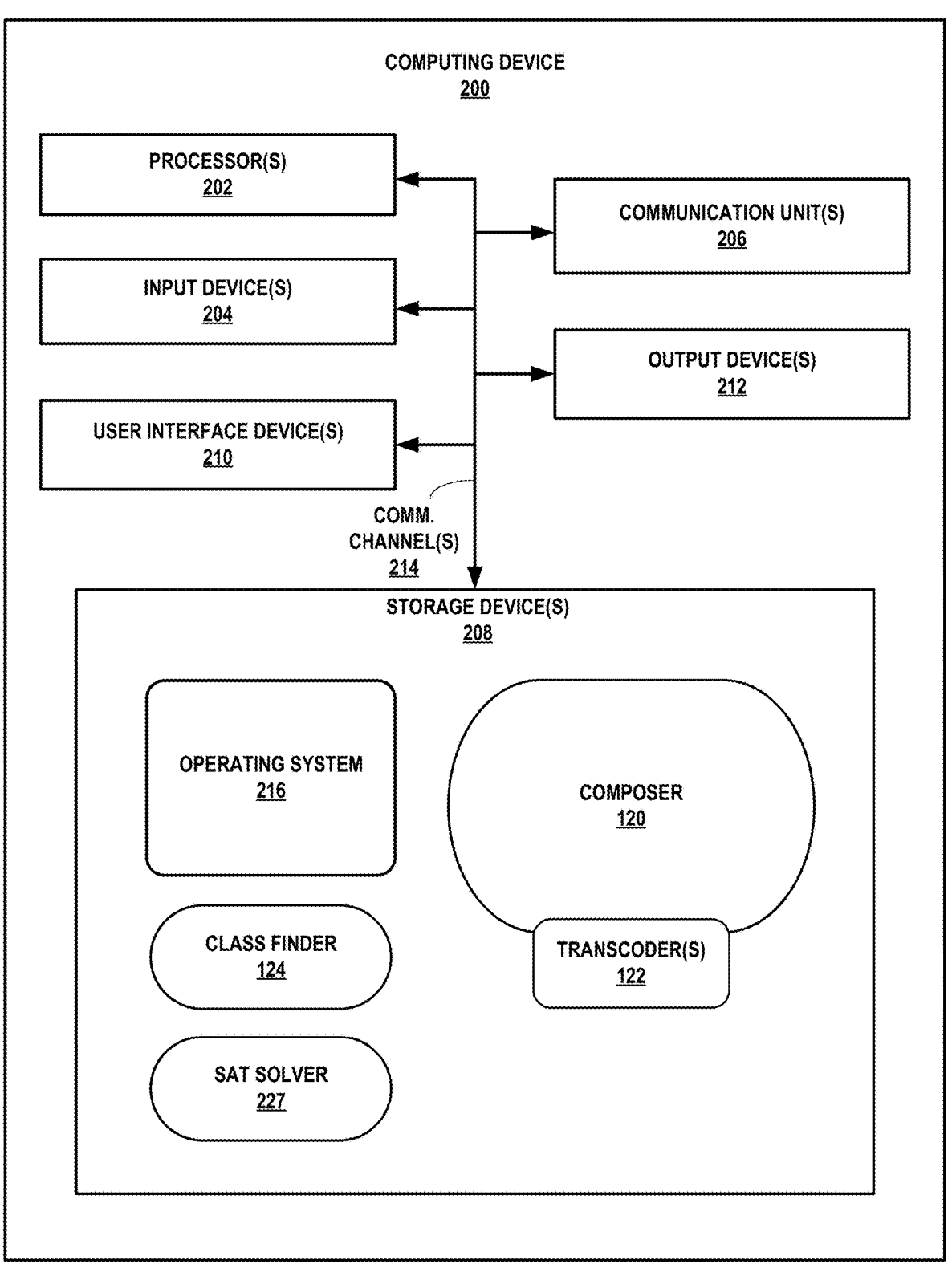
FIG. 2 is a block diagram illustrating an example computing device for storing and communicating bits of information in composite classes of valid data, in accordance with the techniques of the disclosure.

FIG. 2 is a block diagram illustrating an example computing device 200 for storing bits of information in composite classes of valid data, in accordance with the techniques of the disclosure. FIG. 2 may illustrate a particular example of a server or other computing device 200 that includes one or more processor(s) 202 for executing at least a portion of class finder 224, or any other computing device described herein. Other examples of computing device 200 may be used in other instances. In some examples, computing device 200 may be an example of system 100, exclusive of nodes 110. Although shown in FIG. 2 as a stand-alone computing device 200 for purposes of example, a computing device may be any component or system that includes one or more processors or other suitable computing environment for executing software instructions and, for example, need not necessarily include one or more elements shown in FIG. 2 (e.g., computing device 200 may not include communication units 206 and/or user interface devices 210; and in some examples components such as storage device(s) 208 may not be collocated or in the same chassis as other components). Computing device 200 may be located and execute, for example, at another interconnection facility, or at a branch office or cloud computing environment employed or used by a colocation facility or cloud exchange provider.

As shown in the specific example of FIG. 2, computing device 200 includes one or more processors 202, one or more input devices 204, one or more communication units 206, one or more output devices 212, one or more storage devices 208, and one or more user interface (UI) devices 210. Computing device 200, in one example, further includes composer 120, class finder 124, SAT solver 227, and operating system 216 that are executable by computing device 200. Composer 120, class finder 124, and satisfiability (SAT) solver 227 may be applications, processes, libraries, or other executable code. Each of components 202, 204, 206, 208, 210, and 212 are coupled (physically, communicatively, and/or operatively) for inter-component communications. In some examples, communication channels 214 may include a system bus, a network connection, an inter-process communication data structure, or any other method for communicating data. As one example, components 202, 204, 206, 208, 210, and 212 may be coupled by one or more communication channels 214.

Processors 202, in one example, are configured to implement functionality and/or process instructions for execution within computing device 200. For example, processors 202 may be capable of processing instructions stored in storage device 208. Examples of processors 202 may include any one or more of a microprocessor, a controller, a DSP, an ASIC, an FPGA, or equivalent discrete or integrated logic circuitry.

One or more storage devices 208 may be configured to store information within computing device 200 during operation. Storage device 208, in some examples, is described as a computer-readable storage medium. In some examples, storage device 208 is a memory device, meaning that a primary purpose of storage device 208 is not long-term data storage. Storage device 208, in some examples, is described as a volatile memory, meaning that storage device 208 does not maintain stored contents when the computer is turned off. Examples of volatile memories include random access memories (RAM), dynamic random access memories (DRAM), static random access memories (SRAM), and other forms of volatile memories known in the art. In some examples, storage device 208 is used to store program instructions for execution by processors 202. Storage device 208, in one example, is used by software or applications running on computing device 200 to temporarily store information during program execution, such as in a data store (e.g., database or file).

Storage devices 208, in some examples, also include one or more computer-readable storage media. Storage devices 208 may be configured to store larger amounts of information than volatile memory. Storage devices 208 may further be configured for long-term storage of information. In some examples, storage devices 208 include non-volatile storage elements. Examples of such non-volatile storage elements include magnetic hard discs, optical discs, floppy discs, flash memories, or forms of electrically programmable memories (EPROM), electrically erasable and programmable (EEPROM), read only memory (ROM), or programmable read only memory (PROM) memories.

Computing device 200, in some examples, also includes one or more communication units 206. Computing device 200, in one example, utilizes communication units 206 to communicate with external devices via one or more networks, such as one or more wired/wireless/mobile networks. Communication units 206 may include a network interface card, such as an Ethernet card, an optical transceiver, a radio frequency transceiver, or any other type of device that can send and receive information. Other examples of such network interfaces may include one or more of 3G, 4G, 5G, Bluetooth™, IEEE 802.15.4 (e.g., ZigBee™), and Wi-Fi™ radios. In some examples, computing device 200 uses communication unit 206 to communicate with an external device.

Computing device 200, in various examples, also includes one or more user interface devices 210. User interface devices 210, in some examples, are configured to receive input from a user through tactile, audio, or video feedback. Examples of user interface devices(s) 210 include a presence-sensitive display, a mouse, a keyboard, a voice responsive system, video camera, microphone or any other type of device for detecting a command from a user. In some examples, a presence-sensitive display includes a touch-sensitive screen.

One or more output devices 212 may also be included in computing device 200. Output device 212, in some examples, is configured to provide output to a user using tactile, audio, or video outputs or stimuli. Output device 212, in various examples, includes a presence-sensitive display, a sound card, a video graphics adapter card, or any other type of device for converting a signal into an appropriate form understandable to humans and/or machines. Additional examples of output device 212 include a speaker, a cathode ray tube (CRT) monitor, a liquid crystal display (LCD), or any other type of device that can generate intelligible output to a user.

Computing device 200 may include operating system 216. Operating system 216, in some examples, controls the operation of components of computing device 200. In various examples, operating system 216 may facilitate the communication of one or more applications 222 and class finder 224 with processors 202, communication unit 206, storage device 208, input device 204, user interface device 210, and output device 212.

Composer 120, class finder 124, and satisfiability (SAT) solver 227 may include program instructions and/or data that are executable by computing device 200, such as through processor 202 or processing circuitry. For example, composer 120 may include instructions that cause computing device 200 to identify disjoint classes of valid data and generate transcoders and composite transcoders 122 based on classes of valid data. Class finder 224 may include instructions that cause computing device 200 to identify one or more sets of free bits and/or one or more sets of fixed bits of a bitstring format.

SAT solver 227 may be included as an oracle. For example, SAT solver 227 may include instructions that cause computing device 200 to return the following when given a formula or expression $\phi(b)$: (1) an indication that the formula $\phi$ is satisfiable and an assignment of values for each variable in $\phi$ (b) that makes the formula $\phi$ true, or (2) an indication that the formula $\phi$ is unsatisfiable. In operation, SAT solver 227 may determine whether classes of data are classes of valid data and output an indication of a satisfiability state (e.g., valid/true or invalid/false) based on the determination. For example, SAT solver 227 may output an indication of a first satisfiability state (e.g., true) when a formula (e.g., set or class definition/parameters) describes or outputs a class of valid data for a bitstring format and a second satisfiability state (e.g., false) when the formula does not describe or output a class of valid data for the bitstring format. SAT solver 227 may apply various criteria or parameters in determining whether classes of data are valid or invalid. For example, SAT solver 227 may require classes of valid data to have a particular number of free bits to have a first satisfiability state (e.g., true). SAT solver 227 may apply increasingly stronger criteria as composer 120 iterates. For example, SAT solver 227 may require classes of valid data to be disjoint from one or more or all previous classes of valid data to have the first satisfiability state (e.g., true). When a class of data does not have a particular satisfiability state (e.g., the first satisfiability state), SAT solver 227 may output an indication of another satisfiability state (e.g., the second satisfiability state).

In operation, composer 120 may communicate with SAT solver 227 to determine disjoint classes of valid data, classes of valid data with the same number of free bits, or both. For example, composer 120 may input a class of valid data, as may be received from class finder 124, to SAT solver 227 and SAT solver 227 may output a satisfiability state for composer 120 indicating whether the class of valid data is disjoint and/or contains the same number of free bits as earlier classes of valid data. For instance, SAT solver 227 may output "true" when the class of valid data is disjoint and/or has a particular number of free bits and output "false" when the class of valid data is not disjoint and/or does not have the particular number of free bits. Though shown separately, in some examples, SAT solver 227 may be a component or part of composer 120.

Figure 3:
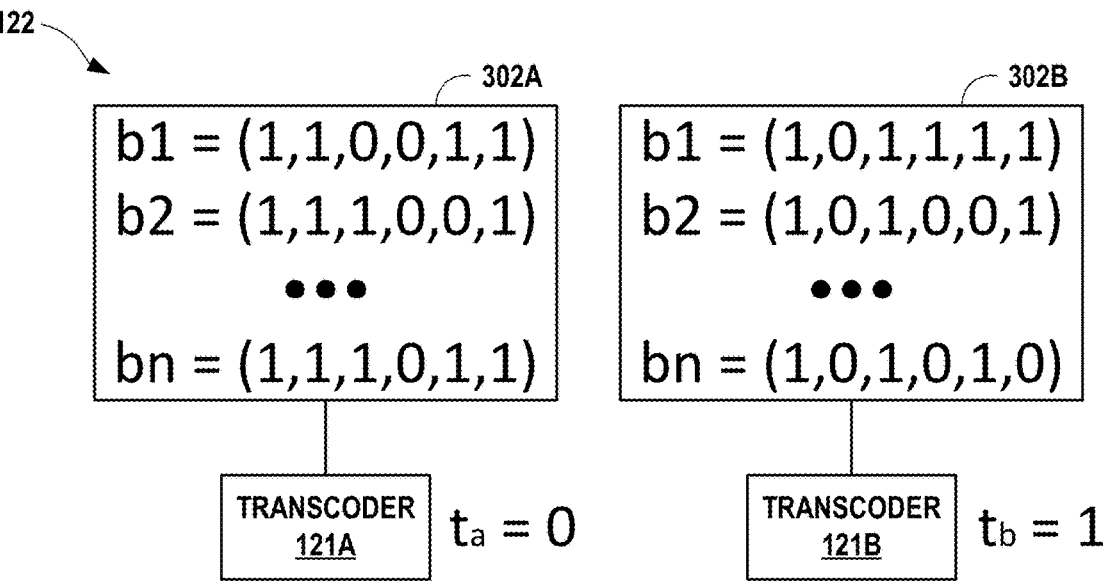
FIG. 3 is a block diagram illustrating a first example of transcoders for storing and communicating bits of information in composite classes of valid data, in accordance with the techniques of the disclosure.

FIG. 3 is a block diagram illustrating a first example of transcoders for storing bits of information in composite classes of valid data, in accordance with the techniques of the disclosure. Some aspects of FIG. 3 are described in the context of FIGS. 1-2 for example purposes only. In some examples for instance, composite transcoder 122 may be part of one or more of nodes 110, as shown in the example of FIG. 1 or composite transcoder may be part of computing device 200, such as shown in the example of FIG. 2. As shown, composite transcoder 122 may include a pair of transcoders 121A, 121B. Composer 120 of FIG. 1, may generate first transcoder 121A that has the output set (e.g., set of bitstrings) of class of valid data 302A and a second transcoder 121B that has the output set (e.g., set of bitstrings) of class of valid data 302B. As shown in FIG. 3 for instance, class of valid data 302A includes first bitstring (b1), second bitstring (b2), . . . n$^{th}$ bitstring (bn) and, similarly, class of valid data 302B includes first bitstring (b1), second bitstring (b2), . . . n$^{th}$ bitstring (bn) where n is a positive integer greater than two. In this manner, any output of transcoder 121A is within class of valid data 302A and any output of transcoder 121B is within class of valid data 302B. As such, class of valid data 302 may be considered and referred to as a set of bitstrings 302.

Composer 120 may generate a transcoder 121 based on a class of valid data 302 found by iterating class finder 124 such that transcoder 121 outputs bitstrings that satisfy (e.g., are valid) one or more bitstring formats. For example, composer 120 may generate a first transcoder 121A that has an output set (e.g., a first set of bitstrings 302A with a first set of free bits) as found by a first iteration of class finder 124 and generate a second transcoder that has an output set (e.g., a second set of bitstrings 302B with a second set free bits) as found by a subsequent iteration of class finder 124.

Transcoders 121 may encode data in the free bits and set particular bit values for the remaining bits (e.g., the fixed bits) to satisfy one or more bitstring formats. In the example of FIG. 3 for instance, the free bits may be the second through sixth bit and the fixed bit may be the first bit, which may always be set to "1" to satisfy the bitstring format. As such, transcoders 121 may freely set the free bits to encode data in the free bits. Class finder 124 may find classes of valid data 302 with different sets of free bits. For instance, with respect to the example of FIG. 3, class finder 124 may find a class of valid data 302 where the free bits may be the second through fifth bits, or other combination of bits.

A set of free bits may be defined in various ways, such as by a formula, expression, one or more heuristics in some examples. For instance, a set of free bits may be defined as one or more n$^{th}$ bits (e.g., first, second, third, last bits, etc.) when one or more m$^{th}$ bits (e.g., fourth, fifth, sixth bits, etc.) have a particular bit value, as will be described further below, with the n$^{th}$ or m$^{th}$ bits referring to a bit position within a bitstring. To illustrate, as shown in FIG. 3, bitstring b1 of set of bitstrings 302A respectively has 1, 1, 0, 0, 1, 1 as the first, second, third, fourth, fifth, and sixth bits. In this case, the sixth bit is also the last bit.

As described above, sets of bitstrings 302A, 302B may be disjoint. For example, first set of bitstrings 302A may include bitstrings having values between 51 and 60 and second set of bitstrings 302B may include bitstrings having values between 41 and 50. Composer 120 may assign first transcoder 121A and second transcoder 121B to composite transcoder 122 to thereby generate composite transcoder 122. Composer 120 may assign different bit values to each transcoder 121 of a composite transcoder 122. In the example of FIG. 3 for instance, first transcoder 121A is assigned a value, t$_a$, of "0" and second transcoder 121B is assigned a value, t$_b$, of "1."

FIG. 4 is a block diagram illustrating a first example process of a system for storing bits of information in composite classes of valid data, in accordance with the techniques of the disclosure. FIG. 4 is described in the context of FIG. 3 for example purposes only. As shown, composite transcoder 122 may encode data 402 (e.g., a bitstring) to generate an encoded bitstring 404. In the example of FIG. 4, data 402 has seven bits. Though described in the examples herein as the last bit, composite transcoder 122 may select any bit of data 402 as a selector bit, such as based on one or more formulas, expressions, or heuristics that identify a bit in data 402 (e.g., the first, last, or any other bit therebetween).

Based on the bit value of the selector bit (e.g., "0" or "1"), composite transcoder 122 may select one of transcoders 121 to encode data 402. For example, composite transcoder 122 may select a transcoder 121 with an assigned value matching the bit value of the selector bit. In the example of FIG. 4 for instance, composite transcoder 122 selects the last bit of data 402 with a bit value of "1" as the selector bit and accordingly selects second transcoder 121B rather than first transcoder 121A to encode the remaining bits of data 402 (e.g., the bits of data 402 not including the selector bit). In such case, composite transcoder 122 encodes data 402 with second transcoder 121B and refrains from encoding data 402 with first transcoder 121A. As shown, encoded data 404 belongs to second set of bitstrings 302B which is in the output set of transcoder 121B. Composer 120 may assign bit values to transcoders 121 and composite transcoders 122.

To decode encoded data 404, transcoder 122 may determine a class of valid data 302 (e.g., set of bitstrings 302) to which encoded data 404 belongs. For example, composite transcoder 122 may identify a set of bitstrings 302 having a bitstring that matches encoded data 404 and select transcoder 121 having the output set of the identified set of bitstrings 302. If set of bitstrings 302 is defined by a formula, expression, or other criteria, composite transcoder 122 may determine whether encoded data 404 is in the set of output of the expression (e.g., satisfies the criteria) to determine whether encoded data is in the class of valid data. In some examples, composite transcoder 122 may determine a bitstring belongs to the particular set of bitstrings 302 based on one or more defining characteristics (e.g., criteria) of set of bitstrings 302. For instance, a set of bitstrings 302 may have bitstrings that each begin or end with a particular bit value (e.g., "1" or "0") or that each have one or more particular bit values at one or more bit positions (e.g., first, second, third bit positions, etc.). As such, composite transcoder 122 may determine encoded data 404 belongs to a set of bitstrings 302 when encoded data 404 shares one or more defining characteristics with set of bitstrings 302 (e.g., begin or end with a particular bit value).

In the example of FIG. 4, composite transcoder 122 determines encoded data 404 is within set of bitstrings 302B and accordingly selects second transcoder 121B rather than first transcoder 121A to decode encoded data 404 to generate a portion of decoded data 406. In such case, composite transcoder 122 decodes encoded data 404 with second transcoder 121B and refrains from decoding encoded data 404 with first transcoder 121A. The portion of decoded data 406 may be n−1 bits where n is the length of data 402. In the example of FIG. 4 for instance, transcoder 121B may decode encoded data 404, [1, 0, 1, 0, 1, 0] to generate a portion of decoded data 406, namely, [1, 0, 0, 1, 0, 1]. As part of generating decoded data, transcoder 122 may include the bit value assigned to the selected transcoder 121. For instance, transcoder 122 may include the bit value $t_b$, which is "1," in the decoded data 406 at the position of the selector bit (e.g., the last position) because transcoder 121B was assigned to the bit value, $t_b$=1. As such, the resulting decoded data 406 is [1, 0, 0, 1, 0, 1, 1], which is n bits in length and matches data 402, as is shown in the example of FIG. 4.

FIG. 5 is a block diagram illustrating a second example of transcoders for storing bits of information in composite classes of valid data, in accordance with the techniques of the disclosure. Some aspects of FIG. 5 are described in the context of FIG. 4. The example of FIG. 5 includes composite transcoder 122 of FIG. 4 as composite transcoder 122A. Composer 120 may iterate class finder 124 to find another class of valid data 302C (e.g., a third set of bitstrings 302C with a third set of free bits), which may be disjoint from previous classes of valid data 302A, 302B. For example, set of bitstrings 302C may be the set of bitstrings having a value between 21 and 30. As described above, class finder 124 may find sets of free bits that are different. In the example of FIG. 5 for instance, the bitstring format may be such that the set of bitstrings 302C may have the second through fifth bits as free bits when the first and sixth bit are "0" and "1," respectively, and have the second through sixth bits as free bits when the first bit is "1," such as described above with respect to the example of FIG. 3. Composite transcoder 122A may freely set the free bits to encode data in the free bits.

Composer 120 may generate transcoder 121C based on set of bitstrings 302C. For example, composer 120 may generate third transcoder 121C that has an output set (e.g., set of bitstrings 302C) that satisfies the one or more bitstring formats. Composer 120 may combine composite transcoder 122A and third transcoder 121C to generate composite transcoder 122B, which is capable of packing (e.g., encoding/decoding) an additional bit relative to composite transcoder 122A and third transcoder 121C individually. Composer 120 may assign bit values for each transcoder 121 and composite transcoder 122. Composer 120 may assign different bit values to each transcoder 121 or composite transcoder 122 in a pair. In the example of FIG. 5 for example, composer 120 may assign composite transcoder 122B bit value $c_a$=0 and transcoder 121C bit value $t_c$=1.

FIG. 6 is a block diagram illustrating a second example process of a system for storing bits of information in composite classes of valid data, in accordance with the techniques of the disclosure. Some aspects of FIG. 6 are described in the context of FIG. 5. As compared to composite transcoder 122 of FIG. 4, composite transcoder 122B may encode/decode eight bits rather than seven bits. As can be seen, data 402 of FIG. 6 has eight bits which composite transcoder 122B encodes in to encoded data 404. Composite transcoder 122B may select a selector bit, such as based on one or more heuristics (e.g., the first, last, or any other bit therebetween). In the example of FIG. 6 for instance, composite transcoder 122B may select the last bit of data 402 as the selector bit. Composite transcoder 122B may, based on the selector bit, select a component transcoder of composite transcoder 122B (e.g., composite transcoder 122A or transcoder 121C) to encode data 404.

In the example of FIG. 6, because the selector bit is "0," composite transcoder 122B may select composite transcoder 122A, which as a bit value $c_a$=0, rather than transcoder 121C, which has a bit value $t_c$=1. Composite transcoder 122B may select another selector bit, such as the second to the last bit of data 402, which is "1," to select a transcoder 121B of composite transcoder 122A, namely, transcoder 121B, which has a matching bit value of $t_b$=1. Composite transcoder 122B may encode the remaining bits of data 402 with selected transcoder 121B to generate encoded data 404. As can be seen from FIG. 3, encoded data 404 is within class of valid data 302B of transcoder 121B.

To decode encoded data 404, composite transcoder 122B may select a transcoder 121 to decode encoded data 404 by identifying the class of valid data 302 to which encoded data 404 belongs. For example, composite transcoder 122B may identify a set of bitstrings 302 having a bitstring that matches encoded data 404 and select transcoder 121 having the output set of the identified set of bitstrings 302. If the set of bitstrings 302 is defined by a formula, expression, or other criteria, composite transcoder 122 may determine whether encoded data 404 is in the set of output of the formula or expression (e.g., satisfies the criteria) to determine whether encoded data is the set of bitstrings 302.

As can be seen, each composite transcoder 122 may include a pair of composite transcoders 122, pair of transcoders 121, or a composite transcoder 122 and transcoder 121 pair nested therein, which may form a hierarchy or binary tree structure. Composite transcoder 122 may decode encoded data 404 by identifying a transcoder 121 based on the encoded data 404, such as by determining a set of bitstrings 302 containing the encoded data 404 and identifying transcoder 121 having an output set of the identified set of bitstrings 302. Composite transcoder 122 may traverse the nesting hierarchy from the identified transcoder to include assigned bit values into decoded data 406. For example, composite transcoder 122 may traverse individual composite transcoders 122 containing the selected transcoder 121, beginning with the innermost composite transcoder 122 and ending with the outermost composite transcoder 122. During such traversal, composite transcoder 122 may include the assigned bit value for each respective composite transcoder 122 to generate decoded data 406, as will now be described.

In the example of FIG. 6 for instance, to decode encoded data 404, composite transcoder 122B may decode encoded data 404 with the selected transcoder 121B to generate a portion of decoded data 406. As composite transcoder 122B traverses the nesting hierarchy, composite transcoder 122B may include assigned bit value $t_b=1$ for the selected transcoder 121B to and assigned bit value $c_a=0$ to the portion of decoded data 406.

Composite transcoder 122B may then traverse any composite transcoders 122 containing identified transcoder 121B to decode the remainder of data 402. In the example of FIG. 6 for instance, composite transcoder 122B traverses to or selects composite transcoder 122A, which includes transcoder 121B. Composite transcoder 122A has an assigned bit value $c_a=0$. As such, composite transcoder 122B may include the assigned bit value of composite transcoder 122A to generate decoded data 406 which matches data 402. As shown in FIG. 6, decoded data 406 ends with [1, 0] corresponding to the nesting of transcoder 121B within composite transcoder 122A and their respective assigned bit values. As can be seen, each composite transcoder 122 may allow an additional bit to be encoded/decoded in this manner. With respect to the example of FIG. 6, when composite transcoder 122B includes the assigned bit values [1, 0], as shown underlined in FIG. 6, decoded data 406 is [1, 0, 0, 1, 0, 1, 1, 0] which matches data 402.

FIG. 7 is a block diagram illustrating a third example of transcoders for storing bits of information in composite classes of valid data, in accordance with the techniques of the disclosure. Some aspects of FIG. 7 are described in the context of FIG. 6. As can be seen from the example of FIG. 7, composer 120 may generate composite transcoder 122 from a pair of composite transcoders 122, in addition to pairs of transcoders 121 or transcoder 121 and composite transcoder 122 pairs. In FIG. 7 for example, composer 120 may generate transcoder 121D based on class of valid data 302D (e.g., set of bitstrings 302D) which is disjoint from the previous classes of valid data 302. Composer 120 may iterate class finder 124 to find another class of valid data 302D (e.g., a fourth set of bitstrings 302D with a fourth set of free bits), which may be disjoint from previous classes of valid data 302A, 302B, 302C. For instance, class of valid data 302D may be the set of bitstrings having values of 11 to 20.

FIG. 8 is a block diagram illustrating a third example process of a system for storing bits of information in composite classes of valid data, in accordance with the techniques of the disclosure. Some aspects of FIG. 8 are described in the context of FIG. 7. In the example of FIG. 8, composite transcoder 122E may encode another additional bit (e.g., nine bits) of data 402 relative to composite transcoder 122B of FIG. 6. Composer 120 may assign bit values such as $t_d=1$ to transcoder 121D, $c_b=1$ to composite transcoder 122B, $c_c=0$ to composite transcoder 122C, and $c_d=1$ to composite transcoder 122D, as shown in the example of FIG. 6. Encoding data 402 and decoding encoded data 404 may occur substantially as described above, such as by composite transcoder 122 repeatedly (e.g., recursively) selecting a selector bit and component transcoder with a matching assigned bit value to encode the remaining bits of data 402 to generate encoded data 404. Composite transcoder 122 may reverse the process to decode encoded data 404, such as by determining a set of bitstrings 302 to which encoded data 404 belongs and decoding encoded data 404 with transcoder 121 generated with the determined set of bitstrings 302 and including assigned bit values for transcoder 121 and each composite transcoder 122 at their respective selector bit positions.

For instance, in the example of FIG. 8, to decode encoded data 404, transcoder 122E may determine that encoded data is within class of valid data 302B which was used to generate transcoder 121B. Transcoder 121B has a bit value $t_b$=1and is nested within (e.g., part of) composite transcoder 122A and composite transcoder 122A has a bit value $c_a=0$ and is nested within composite transcoder 122C. Composite transcoder 122C has a bit value $c_c=0$ and is nested within composite transcoder 122E. As such, transcoder 122E may decode encoded data 404 with transcoder 121B and sequentially include assigned bit values from transcoder 121B, composite transcoder 122A, and composite transcoder 122C at their respective selector bit positions (e.g., the last three bits of data 402, [1, 0, 0]) to generate decoded data 406 which matches data 402. For instance, composite transcoder 122C may have the last bit of data 402 "0" as a selector bit, composite transcoder 122A may have the second to the last bit of data 402 "0" as a selector bit, and transcoder 121B may have the third to the last bit of data 402 "1" as a selector bit. During decoding of encoded data 404, assign bit values of transcoders 121B, 122A, 122C may respectively be included at their selector bit positions to generate these bit values in decoded data 406. As can be seen by the underlining in FIG. 8, decoded data 406 has [1, 0, 0] at the last three positions, which corresponds to the positions of the respective selector bits and decoded data 406, including the assigned bit values, is [1, 0, 0, 1, 0, 1, 1, 0, 0], which matches data 402.

FIGS. 9A-9C are flow charts illustrating example processes for storing bits of information in composite classes of valid data, in accordance with the techniques of the disclosure. FIGS. 9A-9C are described below in the context of FIGS. 1-8 for example purposes only. In general, FIG. 9A illustrates an example process for generating, by processing circuitry 104, transcoders 121 for encoding data at one or more nodes 110, FIG. 9B illustrates an example process for encoding data by one or more nodes 110, and FIG. 9C illustrates an example process for decoding data by one or more nodes 110. System 100, or more particularly, for example, processing circuitry 104, may determine, based on a bitstring format, a first set of bitstrings 302A for a first transcoder 121A (902). For example, processing circuitry 104 may execute class finder 124 to find a first set of bitstrings 302A with a first set of free bits that first transcoder 121A may use to encode data. Processing circuitry 104, may determine, based on the bitstring format, a second set of bitstrings for a second transcoder 121B, where no bitstring of the first set of bitstrings matches a bitstring of the second set of bitstrings (e.g., the first set of bitstrings and the second set of bitstrings are disjoint) (904). For example, processing circuitry 104 may execute class finder 124 to find a second set of bitstrings with a second set of free bits that second transcoder 121A may use to encode data where the second set of bitstrings is disjoint from the first set of bitstrings.

Processing circuitry 104 may determine first set of bitstrings 302A using a first set of free bits and second set of bitstrings 302B using a second set of free bits. For example, processing circuitry 104 may execute class finder 124 to find the first set of free bits and determine a first set of bitstrings 302A, including the first set of free bits, that satisfy the bitstring format (e.g., are valid bitstrings of the bitstring format). For first set of bitstrings 302A to satisfy the bitstring format, the first set of free bits may have any value and the remaining bits may be fixed bits that require particular values (e.g., "0" or "1"). Processing circuitry 104 may execute class finder 124 to find the second set of free bits and determine second set of bitstrings 302B, including the second set of free bits, that satisfy the bitstring format.

In some examples, processing circuitry 104 may execute class finder 124 with a different initial bitstring (e.g., initial value) as compared to the initial bitstring used during the previous iteration (e.g., execution) of class finder 124. Processing circuitry 104 may determine the initial bitstring randomly (but such that the initial bitstring satisfies the bit string format requirements) or through execution of one or more heuristics. For second set of bitstrings 302B to satisfy the bitstring format, the second free bits may have any value and the remaining bits may be fixed bits that require particular values (e.g., "0" or "1"). Processing circuitry 104 may require the number of free bits in the second set of free bits to be the same as the number of free bits in the first set of free bits. Processing circuitry 104 may store the bitstring format on a storage device 208, such as in the form of a protocol format or one or more storage rules for a storage system. First set of bitstrings 302A may constitute a first class of valid data and second set of bitstrings 302B may constitute a second class of valid data.

As described above, class finder 124 may run with a strengthened property to force solutions to satisfy P but be outside of $C_1$ (e.g., solutions disjoint from $C_1$). For example, this may replace P(x) with P(x) &&$\neg C_1$(x) in the algorithm. As such, processing circuitry 104 may generate second set of bitstrings 302B such that no bitstring of first set of bitstrings 302A matches a bitstring of second set of bitstrings 302B. For example, processing circuitry 104 may generate second set of bitstrings 302B by replacing P(x) with P(x) &&$\neg C_1$(x), and/or by determining that each bitstring in first sets of bitstrings 302A does not match any of the bitstrings in second set of bitstrings 302B. Processing circuitry 104 may determine two bitstrings do not match when the two bitstrings are not identical (e.g., when two bitstrings have a bit value that is different for the same bit position).

Processing circuitry 104 may generate first transcoder 121A based on the first set of bitstrings 302A. Similarly, processing circuitry 104 may generate second transcoder 121B based on the second set of bitstrings 302B. In some examples, processing circuitry 104, such as through composer 120, may generate first transcoder 121A that, for a given input, generates an output in the first set of bitstrings 302A (e.g., the first class of valid data) and generate second transcoder 121B that, for a given input, generates an output in the second set of bitstrings 302B (e.g., the disjoint second class of valid data). In some examples, processing circuitry 104 may generate transcoder 121 by generating a mapping from each possible bitstring input to transcoder 121 to an output within the set of bitstrings 302 for transcoder 121. For instance, processing circuitry 104 may generate first transcoder 121A by mapping each possible bitstring input to first transcoder 121A to an output within first set of bitstrings 302A, and generate second transcoder 121B my mapping each possible bitstring input to second transcoder 121B to an output within second set of bitstrings 302B.

In operation, to encode a bitstring, transcoder 121 may read bitstring input (e.g., data) a single bit at a time (e.g., bit by bit) and copy each bit to a free bit position. To decode an encoded bitstring, transcoder 121 may read encoded bitstring input (e.g., encoded data) and copy each bit in a free bit position to a bit position in a decoded bitstring. Processing circuitry 104 may, in some examples, generate transcoder 121 by generating expressions, such as within a DSL, that when executed, perform the foregoing encode and/or decode bit copying operations. For example, processing circuitry 104 may generate first transcoder 121A by generating expressions that cause first transcoder 121A to copy bits of a bitstring input to free bit positions, to output encoded bitstrings within first set of bitstrings 302A. Similarly processing circuitry 104 may generate second transcoder 121B by generating expressions that cause second transcoder 121B to copy individual bits of a bitstring input to free bit positions to output encoded bitstrings within second set of bitstrings 302B.

Processing circuitry 104 may assign a first bit value (e.g., $t_a$=0) to first transcoder 121A and a second bit value e.g., $t_b$=0) to second transcoder 121B with the first bit value having a different value than the second bit value. Processing circuitry 104 may output an indication, such as to one or more nodes 110, indicating the first bit value is assigned to first transcoder 121A and the second bit value is assigned to second transcoder 121B (906). In some examples, processing circuitry 104 may, such as through composer 120, send to nodes 110 and nodes 110 may receive an indication of first transcoder 121A, second transcoder 121B, or both and/or an indication of the first free bits, the second free bits, or both. Processing circuitry 104 may generate a BDD, such as in a DSL, and processing circuitry 104 may output an indication of the BDD and/or DSL to nodes 110. In some examples, processing circuitry 104 may package (e.g., include) the BDD in transcoder 121 and send the BDD along with transcoder 121 to nodes 110. Processing circuitry 104 may output a BDD comprising one or more conditional (e.g., if/then) steps which may be performed based on selector bit values, such as described above with respect to FIGS. 3-8. For example, the BDD, when executed at node 110, may cause node 110 to operate such that, if the selector bit is a first bit value (e.g., "0"), then node 110 may select transcoder 121 with a matching assigned bit value (e.g., first transcoder 121A) for encoding and/or decoding purposes and if the selector bit is a different second bit value (e.g., "1"), then node 110 may select another transcoder with a matching assigned bit value (e.g., second transcoder 121B) for encoding and/or decoding purposes. Similar to above, in this example, the first bit value (e.g., "0") is assigned to first transcoder 121A and the second bit value (e.g., "1') is assigned to second transcoder 121B.

FIG. 9B illustrates an example process for encoding data by one or more nodes 110. Though described with respect to first node 110A and second node 110B, the process for encoding data may be performed by various nodes 110. First node 110A may receive, from processing circuitry 104, the first bit value assigned to first transcoder 121A and the second bit value assigned to second transcoder 121B (908). First node 110A may use the first bit value and the second bit value to select a transcoder 121 for encoding purposes and include the first bit value or the second bit value when decoding encoded data, as will now be described. Nodes 110 may execute transcoders 121 and composite transcoders 122, as described below, to encode/decode data.

First node 110A may generate data to encode (910). For example, first node 110A may generate data 402 of FIG. 4.

Data 402 may be various data, such as data first node 110A generates during operation. For example, first node 110A may be a computing device that generates data 402 to communicate with second node 110B such as for communication or data storage purposes. First node 110A may generate data 402 based on data received by first node 110A in some examples.

First node 110A may select the first transcoder 121A or the second transcoder 121B as a selected transcoder based on a bit value at a selector bit position (e.g., selector bit value) within data 402 (912). For example, first node 110A, such as through composite transcoder 122, may select any bit of data 402 as a selector bit, such as based on one or more formulas, expressions, or heuristics that identify a bit in data 402 (e.g., the first, last, or any other bit therebetween). First node 110A, through the selected transcoder, may encode data 402 into the bitstring format (e.g., in the free bits of the bitstring format) to generate encoded data 404 (914). First node 110 may encode data 402 such that encoded data 404 is within the first set of bitstrings when the selected transcoder is first transcoder 121A and within the second set of bitstrings when the selected transcoder is second transcoder 121B. First node 110A may output encoded data 406 (916). For example, first node 110A may output encoded data 406 to a network or other communication link that supports a protocol session 111 or a storage device 208, where the communication link may be transitory data storage and the storage device 208 may be non-transitory data storage. First node 110A may select first transcoder 121A as the selected transcoder when the bit value of the selector bit matches the first bit value (e.g., $t_a$=0) and select second transcoder 121B as the selected transcoder when the bit value of the selector bit matches the second bit value (e.g., $t_b$=1). First node 110A may select the selector bit based in various ways. For example, first node 110A may select a bit of data 402 as a selector bit, such as based on one or more formulas, expressions, heuristics, or criteria that identify a bit in data 402 (e.g., the first, last, or any other bit therebetween).

A second node 110B of nodes 110 may receive encoded data 404 from first node 110A and decode encoded data 404. For example, second node 110B may determine whether encoded data 404 corresponds to first set of bitstrings 302A or second set of bitstrings 302B (e.g., is within first set of bitstrings 302A or second set of bitstrings 302B). For example, second node 110 may evaluate a formula, expression, or other representation of first set of bitstrings 302A, second set of bitstrings 302B, or both to determine whether encoded data is in first set of bitstrings 302A or second set of bitstrings 302B. Based on determining whether encoded data 404 corresponds to the first set of bitstrings 302A or second set of bitstrings 302B (e.g., is within first set of bitstrings 302A or second set of bitstrings 302B), second node 110B may decode, with first transcoder 121A or second transcoder 121B, encoded data 404 to generate decoded data 406 corresponding to data 402 (e.g., matching data 402).

To decode the encoded data, second node 110B may include, in decoded data 406, the first bit value at the selector bit position when encoded data 404 is in first set of bitstrings 302A and include, in decoded data 406, second bit value at the selector bit position when encoded data 404 is in second set of bitstrings 302B. As described above, processing circuitry 104, such as of first node 110A, may assign the first bit value to first transcoder 121A and second bit value to second transcoder 121B with the first bit value having a different value than the second bit value. As such, in some examples, second node 110B may determine the first bit value (e.g., "0" or "1") from first transcoder 121A and the second bit value (e.g., "0" or "1") from second transcoder 121B. First node 110A may send (e.g., output) an indication of the selector bit, such as the position and/or bit value of the selector bit to second node 110B and second node 110B may receive the indication from first node 110A. First node 110A may send, to second node 110B, an indication of the first bit value and the second bit value and/or an indication that the first bit value is assigned to first transcoder 121A and the second bit value is assigned to second transcoder 121B. Second node 110B may include the first bit value or the second bit value in decoded data 406 at the position of the selector bit selected by first node 110A. In some examples, second node 110B may determine the first bit value and the second bit value based on the indication of the first bit value and the second bit value and/or the indication that the first bit value is assigned to first transcoder 121A and the second bit value is assigned to second transcoder 121B received from first node 110A.

Processing circuitry 104 may associate the first transcoder 121A with the second transcoder 121B to form a composite transcoder 122A and composite transcoder 122A may be used to encode/decode data 402, such as shown in the examples of FIGS. 3-6. For example, processing circuitry 104 may determine, based on the bitstring format, a third set of bitstrings 302C for a third transcoder 121C where third set of bitstrings 302C is different than first set of bitstrings 302A and second set of bitstrings 302B. Processing circuitry 104 may assign a third bit value (e.g., $t_c$=1) to third transcoder 121C and a fourth bit value (e.g., $c_a$=0) to composite transcoder, the third bit value different than the fourth bit value. Processing circuitry 104 may output an indication to nodes 110 indicating the third bit value is assigned to third transcoder 121C and the fourth bit value is assigned to composite transcoder 122A. Nodes 110 may use the third bit value and the fourth bit value to select a composite transcoder 122 or transcoder 121 for encoding purposes and include the third bit value or the fourth bit value when decoding encoded data.

For example, first node 110A may receive data 402 to encode, select third transcoder 121C or composite transcoder 122A as a selected transcoder based on a bit value at a selector bit position within data 402, and encode data 402 into the bitstring format with the selected transcoder to generate encoded data 404. First node 110A may output encoded data 404 to a data storage medium, such as that of a network or other communication link that supports a protocol session 111 or a storage device 208, as described above.

As described above, system 100 may determine the set of free bits such as with class finder 124. Some example techniques for finding sets of free bits, which may be executed by class finder 124, are described in "IDENTIFYING FIXED BITS OF A BITSTRING FORMAT," U.S. Pat. No. 11,423,247, filed Apr. 3, 2020, the entire contents of which are hereby incorporated by reference. For instance, to determine a set of free bits processing circuitry 104, such as through class finder 124, may generate a first bitstring having, for a first set of bits of the first bitstring, respective first bit values that have a first satisfiability state for requirements of the bitstring format. Processing circuitry 104 may generate one or more second bitstrings having, for a second set of bits of the one or more second bitstrings, respective second bit values that have a second satisfiability state for the requirements of the first bitstring format. The second bit values may include common bit values in common with one or more of the first bit values and remaining bit values.

Processing circuitry 104 may determine a set of free bits (e.g., the first set of free bits or second set of free bits) based on the common bit values. In some examples, processing circuitry may determine a set of fixed bits based on the remaining bit values.

FIG. 9C illustrates an example process for decoding data by one or more nodes 110. Though described with respect to first node 110A and second node 110B, the process for encoding data may be performed by various nodes 110. In some examples, second node 110B may determine whether the encoded data corresponds to first set of bitstrings 302A or second set of bitstrings 302B (920). For example, second node 110B may determine encoded data 404 is within first set of bitstrings 302A by determining encoded data 404 matches (e.g., is identical to) a bitstring in first set of bitstrings 302A and determine encoded data 404 is within second set of bitstrings 302B by determining encoded data 404 matches (e.g., is identical to) a bitstring of second set of bitstrings 302B.

If set of bitstrings 302 is defined by a formula, expression, or other criteria, composite transcoder 122 may determine whether encoded data 404 is in the set of output of the formula or expression (e.g., satisfies the criteria) to determine whether encoded data is in the class of valid data. In some examples, composite transcoder 122 may determine a bitstring belongs to the particular set of bitstrings 302 based on one or more defining characteristics (e.g., criteria) of set of bitstrings 302. For instance, a set of bitstrings 302 may have bitstrings that each begin or end with a particular bit value (e.g., "1" or "0") or that each have one or more particular bit values at one or more bit positions (e.g., first, second, third bit positions, etc.). As such, composite transcoder 122 may determine encoded data 404 belongs to a set of bitstrings 302 when encoded data 404 shares one or more defining characteristics with set of bitstrings 302 (e.g., begin or end with a particular bit value).

Based on determining whether encoded data 404 corresponds to first set of bitstrings 302A or second set of bitstrings 302B, second node 110B may decode, with first transcoder 121A or second transcoder 121B, encoded data 404 to generate decoded data 406 corresponding to data 402 (922). To decode encoded data 404, second node 110B may include, in decoded data 406, the first bit value at the selector bit position when encoded data 404 is in first set of bitstrings 302A and include, in decoded data 406, the second bit value at the selector bit position when encoded data 404 is in second set of bitstrings 302B. In some examples, second node 110B may include the first bit value in decoded data 406 when encoded data 404 is in first set of bitstrings 302A and include the second bit value in decoded data 406 when encoded data 404 is in second set of bitstrings 302B based on the BDD packaged in composite transcoder 122A. For example, the BDD may comprise one or more conditional steps in the DSL for transcoders that, when executed by second node 110B, cause second node 110B to include the first bit value in decoded data 406 when encoded data 404 is in first set of bitstrings 302A and include the second bit value in decoded data 406 when encoded data 404 is in second set of bitstrings 302B.

Second node 110B may include the first bit value or the second bit value in decoded data 406 at the position of the selector bit selected by first node 110A. Second node 110B may receive an indication of the selector bit, such as the position of selector bit, from first node 110A such as described above. For example, first node 110A may send an indication that the selector bit is the last bit of data 402 to second node 110B and second node 110B may include the first bit value or the second bit value as the last bit of decoded data 406. In some examples, second node 110B may determine the first bit value and the second bit value based on the indication of the first bit value and the second bit value received from first node 110A and/or the indication that the first bit value is assigned to first transcoder 121A and the second bit value is assigned to second transcoder 121B received from first node 110A received from first node 110A.

FIG. 10 is a conceptual diagram illustrating a first example use case in accordance with the techniques of the disclosure. FIG. 10 is described below in the context of FIG. 1 for example purposes only. In this example, airplane 1010A may exchange, via distributed network 1060, data with airplanes 1010B, 1010C using first protocol messages that conform to a first bitstring format for a first protocol. In this example, airplane 1010A may exchange, via disaggregated network 1062, data with airplane 1010B using second protocol messages that conform to a second bitstring format for a second protocol. Airplane 1010C may exchange, via anti-jam network 1064, data with airplane 1010N using third protocol messages that conform to a third bitstring format for a third protocol. Airplanes 1010 of FIG. 10 may be examples of nodes 110 of FIG. 1 in some examples.

Rather than configuring airplanes 1010A-1010N (collectively, "airplanes 1010") with a single protocol (e.g., only the first protocol) or configuring each of airplanes 1010 to support all protocols used by airplanes 1010 (e.g., the first protocol, the second protocol, and the third protocol), airplanes 1010 may be configured to use free bits. For example, composite transcoder 122 may encode data into encoded data that satisfies requirements of the first bitstring format for distributed network 1060, the second bitstring format for disaggregated network 1062, and the third bitstring format for anti-jam network 1064. Transcoders 122 at airplanes 1010 may generate encoded data having fixed bit values to satisfy requirements of the first bitstring format and one or more free bits. For example, airplane 1010A may, such as through composite transcoder 122, encode one or more additional bits in the free bits to output, via airplane 1010C, data to airplane 1010N. In this way, airplanes 1010 may more efficiently exchange data using one or more free bits.

Techniques described herein may help to allow airplanes 1010, which may be each configured for different protocols to communicate. For example, rather than relying on configuring each airplane of airplanes 1010 with a particular protocol or relying on configuring each airplane of airplanes 1010 with all of the protocols used by airplanes 1010 to allow communication between each airplane of airplanes 1010, techniques described herein may configure each airplane of airplanes 1010 to communicate using one or more free bits identified by processing circuitry 104 that satisfy a bitstring format for airplanes 1010. In this way, techniques described herein may help to automatically construct transcoders that enable transmission of data over networks 1060-1064, which may improve a data throughput of networks 1060-1064.

FIG. 11 is a conceptual diagram illustrating a second example use case in accordance with the techniques of the disclosure. FIG. 11 is described in the context of FIG. 11 for example purposes only. In this example, smart phone 1110C may exchange, via custom network 1160, data with smart weighing machine 1110A and smart watch 1110B using first protocol messages that conform to a first bitstring format for a first protocol. In this example, smart weighing machine 1110A may exchange, via proprietary network 1162, data with smart watch 1110B using second protocol messages that conform to a second bitstring format for a second protocol. Smart weighing machine 1110A, smart watch 1110B, and smart phone 1110C may be examples of nodes 110 of FIG. 1 in some examples.

Rather than configuring smart weighing machine 1110A, smart watch 1110B, and smart phone 1110C with a single protocol (e.g., only the first protocol or only the second protocol) or configuring each of smart weighing machine 1110A, smart watch 1110B, and smart phone 1110C to support all protocols used (e.g., the first protocol and the second protocol), smart weighing machine 1110A, smart watch 1110B, and smart phone 1110C may be configured to use free bits. For example, composite transcoder 122 may encode data into encoded data that satisfies requirements of the first bitstring format for custom network 1160 and the second bitstring format for proprietary network 1162. Respective transcoders 122 at smart weighing machine 1110A, smart watch 1110B, and smart phone 1110C may generate one or more bitstrings having fixed bit values that satisfy the first and second bitstring formats and also one or more free bits. For example, smart weighing machine 1110A may use the one or more free bits to output, via smart phone 1110C, data to smart watch 1110B. For instance, smart weighing machine 1110A may output, via smart phone 1110C, a bit string of free bits to smart watch 1110B. In this way, smart weighing machine 1110A, smart watch 1110B, and smart phone 1110C may more efficiently exchange data using one or more free bits by encoding one or more additional bits in the one or more free bits.

Techniques described herein may help to allow smart weighing machine 1110A, smart watch 1110B, and smart phone 1110C, which may be each configured for different protocols to communicate. For example, rather than relying on configuring each one of smart weighing machine 1110A, smart watch 1110B, and smart phone 1110C with a particular protocol or relying on configuring each one of smart weighing machine 1110A, smart watch 1110B, and smart phone 1110C with all of the protocols used by smart weighing machine 1110A, smart watch 1110B, and smart phone 1110C to allow communication between each one of smart weighing machine 1110A, smart watch 1110B, and smart phone 1110C, techniques described herein may configure each one of smart weighing machine 1110A, smart watch 1110B, and smart phone 1110C to communicate using one or more free bits identified by processing circuitry 104 that satisfy a bitstring format for smart weighing machine 1110A, smart watch 1110B, and smart phone 1110C. In this way, techniques described herein may help to automatically construct transcoders 122 that enable transmission of data over networks 1160-1162, which may improve a data throughput of networks 1160-1162.

FIG. 12 is a conceptual diagram illustrating a third example use case in accordance with the techniques of the disclosure. FIG. 12 in the context of FIG. 11 for example purposes only. In the example of FIG. 12, nodes 110 of FIG. 1 may be configured to use class composite transcoder 122 of FIG. 1 as a protocol-level compression technique. For example, composite transcoder 122 may help to reduce a total number of bits sent on a communication channel, in order to communicate an original message 1202.

In the example of FIG. 12, nodes 110 of FIG. 1 may be configured to use composite transcoder 122 of FIG. 1 in a multi-stage setting, where data is transformed in an invertible transformation (e.g., invertible transform 1204 and/or invertible transform 1214). For example, node 110A may apply invertible transformation 1204 to original message 1202. Composite transcoder 122 at node 110A may add additional information 1208 to the one or more free bits of the result of invertible transformation 1204 to generate modified message 1206 and transmit modified message 1206 to node 110B. Composite transcoder 122 may encode one or more additional bits of additional information 1208 into the one or more free bits to improve the efficiency of communication. For instance, node 110A, through composite transcoder 122, may set the one or more free bits to correspond to values of additional information 1208.

Node 110B of FIG. 1 may be configured to receive a modified message 1216, which may be identical to modified message 1206, from node 110A and receive an indication of the one or more free bits from class finder 124 of FIG. 1. In this example, node 110B may determine additional information 1218 from the one or more free bits of modified message 1216. Node 110B may apply composite transcoder 122 to modified message 1216 to generate original message 1212. In this way, additional information 1208 may be "mixed in" with the original message 1202 to generate modified message 1206, that goes through the communication channel. In this example, node 110B may separate modified message 1216 to generate original message 1212 (using composite transcoder 122) and additional information 1218.

Techniques described herein may help to allow a higher data compression rate of a communication channel. For example, system 100 of FIG. 1 may be configured to add additional information for transmission on the communication channel to an original message. In this way, techniques described herein may help to "compress" data on a communication channel, which may improve a data throughput of system 100.

The speed of the free-bit-finder process (e.g., a free-bit-finder algorithm) described herein may enable "real-time" analysis and use of a communication channel, where even protocols that were not known at compile/build time of the system, could be analyzed or re-analyzed during run time to (re) plan marshalling and unmarshalling of information on a communication channel that changes during runtime.

The techniques described in this disclosure may be implemented, at least in part, in hardware, software, firmware or any combination thereof. For example, various aspects of the described techniques may be implemented within one or more processors, including one or more microprocessors, DSPs, ASICs, FPGAs, or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a non-transitory computer-readable storage medium, containing instructions. Instructions embedded or encoded in a computer-readable storage medium may cause a programmable processor, or other processor, to perform the method, e.g., when the instructions are executed. Computer readable storage media may include RAM, ROM, PROM, EPROM, electronically EEPROM, flash memory, a hard disk, a CD-ROM, a floppy disk, a cassette, magnetic media, optical media, or other computer readable media.

What is claimed is:

1. A system comprising:

a storage device configured to store an indication of a bitstring format; and processing circuitry configured to:

determine, based on the bitstring format, a first set of bitstrings for a first transcoder;

determine, based on the bitstring format, a second set of bitstrings for a second transcoder, wherein no bitstring of the first set of bitstrings matches a bitstring of the second set of bitstrings; and output, to a node, an indication of a first bit value assigned to the first transcoder and a second bit value assigned to the second transcoder, wherein the indication of the first bit value assigned to the first transcoder and the second bit value assigned to the second transcoder causes the node to select the first transcoder or the second transcoder to encode data.

2. The system of claim 1, further comprising a first the node, wherein the node is configured to:

generate the data to encode, select the first transcoder or the second transcoder as a selected transcoder based on the indication of the first bit value assigned to the first transcoder and the second bit value assigned to the second transcoder and based on a bit value at a selector bit position within the data;

encode the data into the bitstring format with the selected transcoder to generate encoded data, wherein the encoded data is within the first set of bitstrings when the selected transcoder is the first transcoder and within the second set of bitstrings when the selected transcoder is the second transcoder; and output the encoded data.

3. The system of claim 2, wherein the node is configured to select the first transcoder as the selected transcoder when the bit value at the selector bit position matches the first bit value assigned to the first transcoder and select the second transcoder as the selected transcoder when the bit value at the selector bit position matches the second bit value assigned to the second transcoder.

4. The system of claim 2, wherein the node is further configured to select the selector bit position.

5. The system of claim 2, wherein the node is a first node, the system further comprising a second node configured to:

determine whether the encoded data corresponds to the first set of bitstrings or the second set of bitstrings; and based on the determination of whether the encoded data corresponds to the first set of bitstrings or the second set of bitstrings, decode, with the first transcoder or the second transcoder, the encoded data to generate decoded data corresponding to the data, wherein to decode the encoded data, the second node is configured to include, in the decoded data, the first bit value assigned to the first transcoder at the selector bit position based on the determination that the encoded data corresponds to the first set of bitstrings and include, in the decoded data, the second bit value assigned to the second transcoder at the selector bit position based on the determination that the encoded data corresponds to the second set of bitstrings.

6. The system of claim 1, wherein to determine the second set of bitstrings for the second transcoder, the processing circuitry is configured to determine the second set of bitstrings such that a second set of free bits for the second set of bitstrings is different than a first set of free bits for the first set of bitstrings and the second set of free bits has a number of free bits that is the same as a number of free bits in the first set of free bits.

7. The system of claim 1, wherein the bitstring format is a format selected from one or more of:

a protocol format; or one or more storage rules for a storage system.

8. A system comprising:

a storage device configured to store an indication of a bitstring format; and processing circuitry configured to:

determine, based on the bitstring format, a first set of bitstrings for a first transcoder;

determine, based on the bitstring format, a second set of bitstrings for a second transcoder, wherein no bitstring of the first set of bitstrings matches a bitstring of the second set of bitstrings;

associate the first transcoder with the second transcoder to form a composite transcoder;

determine, based on the bitstring format, a third set of bitstrings for a third transcoder, the third set of bitstrings different than the first set of bitstrings and the second set of bitstrings; and output an indication of a first bit value assigned to the third transcoder and a second bit value assigned to the composite transcoder.

9. The system of claim 8, further comprising a node configured to:

receive data to encode;

select the third transcoder or the composite transcoder as a selected transcoder based on a bit value at a selector bit position within the data;

encode the data into the bitstring format with the selected transcoder to generate encoded data, wherein the encoded data is within the third set of bitstrings when the selected transcoder is the third transcoder and within the first set of bitstrings or the second set of bitstrings when the selected transcoder is the composite transcoder; and output the encoded data.

10. A method comprising:

determining, by processing circuitry and based on a bitstring format, a first set of bitstrings for a first transcoder;

determining, by the processing circuitry and based on the bitstring format, a second set of bitstrings for a second transcoder, wherein no bitstring of the first set of bitstrings matches a bitstring of the second set of bitstrings; and outputting, by the processing circuitry, to a node, an indication of a first bit value assigned to the first transcoder and a second bit value assigned to the second transcoder, wherein the indication of the first bit value assigned to the first transcoder and the second bit value assigned to the second transcoder causes the node to select the first transcoder or the second transcoder to encode data.

11. The method of claim 10, further comprising:

generating, by the node, the data to encode, selecting, by the node, the first transcoder or the second transcoder as a selected transcoder based on the indication of the first bit value assigned to the first transcoder and the second bit value assigned to the second transcoder and based on a bit value at a selector bit position within the data;

encoding, by the node, the data into the bitstring format with the selected transcoder to generate encoded data, wherein the encoded data is within the first set of bitstrings when the selected transcoder is the first transcoder and within the second set of bitstrings when the selected transcoder is the second transcoder; and outputting, by the node, the encoded data.

12. The method of claim 11, wherein selecting the first transcoder or the second transcoder as the selected transcoder comprises, selecting, by the node, the first transcoder as the selected transcoder when the bit value at the selector bit position matches the first bit value assigned to the first transcoder and selecting, by the node, the second transcoder as the selected transcoder when the bit value at the selector bit position matches the second bit value assigned to the second transcoder.

13. The method of claim 11, further comprising selecting, by the node, the selector bit position.

14. The method of claim 11, wherein the node is a first node, the method further comprising:

determining, by a second node, whether the encoded data corresponds to the first set of bitstrings or the second set of bitstrings; and based on the determination of whether the encoded data corresponds to the first set of bitstrings or the second set of bitstrings, decoding, by the second node and with the first transcoder or the second transcoder, the encoded data to generate decoded data corresponding to the data, wherein decoding the encoded data comprises including, by the second node and in the decoded data, the first bit value assigned to the first transcoder at the selector bit position based on the determination that the encoded data is in the first set of bitstrings and including, by the second node and in the decoded data, the second bit value assigned to the second transcoder at the selector bit position based on the determination that the encoded data is in the second set of bitstrings.

15. The method of claim 10, wherein determining the second set of bitstrings for the second transcoder comprises determining, by the processing circuitry, the second set of free bits such that a second set of free bits for the second set of bitstrings is different than a first set of free bits for the first set of bitstrings and the second set of free bits has a number of free bits that is the same as a number of free bits in the first set of free bits.

16. The method of claim 10, wherein the bitstring format is a format selected from one or more of:

a protocol format; or one or more storage rules for a storage system.

17. A method comprising:

determining, by processing circuitry and based on a bitstring format, a first set of bitstrings for a first transcoder;

determining, by the processing circuitry and based on the bitstring format, a second set of bitstrings for a second transcoder, wherein no bitstring of the first set of bitstrings matches a bitstring of the second set of bitstrings;

associating, by the processing circuitry, the first transcoder with the second transcoder to form a composite transcoder; and determining, by the processing circuitry and based on the bitstring format, a third set of bitstrings for a third transcoder, the third set of bitstrings different than the first set of bitstrings and the second set of bitstrings; and outputting, by the processing circuitry, an indication of a first bit value assigned to the third transcoder and a second bit value assigned to the composite transcoder.

18. The method of claim 17, further comprising:

receiving, by a node, data to encode;

selecting, by the node, the third transcoder or the composite transcoder as a selected transcoder based on a bit value at a selector bit position within the data;

encoding, by the first node, the data into the bitstring format with the selected transcoder to generate encoded data, wherein the encoded data is within the third set of bitstrings when the selected transcoder is the third transcoder and within the first set of bitstrings or the second set of bitstrings when the selected transcoder is the composite transcoder; and outputting, by the first node, the encoded data.

19. Non-transitory computer-readable media comprising instructions that, when executed by processing circuitry, cause the processing circuitry to:

determine, based on a bitstring format, a first set of bitstrings for a first transcoder;

determine, based on the bitstring format, a second set of bitstrings for a second transcoder, wherein no bitstring of the first set of bitstrings matches a bitstring of the second set of bitstrings; and output, to a node, an indication of a first bit value assigned to the first transcoder and a second bit value assigned to the second transcoder, wherein the indication of the first bit value assigned to the first transcoder and the second bit value assigned to the second transcoder causes the node to select the first transcoder or the second transcoder to encode data.

20. Non-transitory computer-readable media comprising instructions that, when executed by processing circuitry, cause the processing circuitry to:

determine, based on a bitstring format, a first set of bitstrings for a first transcoder;

determine, based on the bitstring format, a second set of bitstrings for a second transcoder, wherein no bitstring of the first set of bitstrings matches a bitstring of the second set of bitstrings;

associate the first transcoder with the second transcoder to form a composite transcoder; and determine, based on the bitstring format, a third set of bitstrings for a third transcoder, the third set of bitstrings different than the first set of bitstrings and the second set of bitstrings; and output an indication of a first bit value assigned to the third transcoder and a second bit value assigned to the composite transcoder.

* * * * *